United States Patent
Jacobson et al.

(10) Patent No.: US 7,651,926 B2
(45) Date of Patent: Jan. 26, 2010

(54) RAPID PATTERNING OF NANOSTRUCTURES

(75) Inventors: Joseph M. Jacobson, Newton, MA (US); Jae-bum Joo, Cambridge, MA (US); Jon Varsanik, Allston, MA (US); Vikrant Agnihotri, Jersey City, NJ (US)

(73) Assignee: Massachusetts Institute of Technology, Cambridge, MA (US)

( * ) Notice: Subject to any disclaimer, the term of this patent is extended or adjusted under 35 U.S.C. 154(b) by 226 days.

(21) Appl. No.: 11/330,865

(22) Filed: Jan. 12, 2006

(65) Prior Publication Data
US 2007/0197044 A1    Aug. 23, 2007

Related U.S. Application Data

(63) Continuation-in-part of application No. 10/444,176, filed on May 23, 2003.

(60) Provisional application No. 60/383,396, filed on May 24, 2002, provisional application No. 60/643,254, filed on Jan. 12, 2005.

(51) Int. Cl.
*H01L 21/20* (2006.01)
*H01L 21/31* (2006.01)

(52) U.S. Cl. .................. 438/478; 438/758; 438/962

(58) Field of Classification Search ........... 438/473, 438/478, 758, 962; 257/E21.09, E29.07, 257/E29.071; 977/890, 901
See application file for complete search history.

(56) References Cited

U.S. PATENT DOCUMENTS

| 5,148,034 | A | 9/1992 | Koike et al. |
|---|---|---|---|
| 5,406,314 | A | 4/1995 | Kuehnle |
| 6,294,401 | B1 | 9/2001 | Jacobson et al. |
| 6,348,295 | B1 | 2/2002 | Griffith et al. |
| 6,706,473 | B1 | 3/2004 | Edman et al. |
| 7,067,341 | B2 | 6/2006 | Mascolo et al. |
| 2001/0022344 | A1* | 9/2001 | Takada et al. ............... 250/288 |
| 2002/0043624 | A1* | 4/2002 | Hindsgaul et al. ....... 250/423 R |
| 2002/0098653 | A1* | 7/2002 | Flagan et al. ............... 438/260 |
| 2002/0121599 | A1* | 9/2002 | Kato .......................... 250/288 |
| 2004/0029297 | A1 | 2/2004 | Bonnell et al. |
| 2004/0137527 | A1 | 7/2004 | Sleytr et al. |

OTHER PUBLICATIONS

H. Fudouzi, M. Kobayashi, and N. SHinya, Assembling 100 nm scale paticles by an electrostatic potential field, Journal of Nanoparticle Research 3:193-200, 2001.*

(Continued)

*Primary Examiner*—Hung Vu
(74) *Attorney, Agent, or Firm*—Norma E. Henderson

(57) ABSTRACT

A process for forming nanostructures comprises generating charged nanoparticles with an electrospray system in a vacuum chamber and introduction of the charged nanoparticles to a region proximate to a charge pattern, so that the particles adhere to the charge pattern in order to form the feature. Two- or three-dimensional nanostructures may be formed by rapidly creating a charge pattern of nanoscale dimensions on a substrate using a normal electron beam or a microcolumn electron beam, generating high purity nanoscale or molecular size scale building blocks of a first type that image the charge pattern using the electrospray system, and then optionally sintering the building blocks to form the feature.

14 Claims, 25 Drawing Sheets

OTHER PUBLICATIONS

V. N. Morozov, and T. Y Morozova, Electrospray deposition as a method for mass fabrication of mono- and multicomponent microarrays of biological and biologically active substances, Analytical, Chemistry, vol. 71, No. 15, Aug. 1, 1999.*

Bezryadin, A. et al., "Electrostatic trapping of single conducting nanoparticles between nanoelectrodes", *Appl. Phys. Lett.*, Sep. 1, 1997, pp. 1273-1275, vol. 71, No. 9, American Institute of Physics.

Bickmore, J.T., "Aerosol Development", *Xerography and Related Processes*, edited by John H. Dessauer and Harold E. Clark, 1965, pp. 309-340, Chapter 11, The Focal Press, London and New York.

Dai, H. et al., "Controlled Chemical Routes to Nanotube Architectures, Physics, and Devices," *J. Phys. Chem. B*, vol. 1999, pp. 11246-11255, vol. 103, No. 51, The American Chemical Society.

Fudouzi, H. et al., "Site-Controlled Deposition of Microsized Particles Using an Electrostatic Assembly," *Adv. Mater.*, 2002, pp. 1649-1652, vol. 14, No. 22, Wiley-VCH Verlag GmbH & Co. KGaA, Weinheim.

Hu, J. et al., "Chemistry and Physics in One Dimension: Synthesis and Properties of Nanowires and Nanotubes," *Acc. Chem. Res.*, 1999, pp. 435-445, vol. 32, No. 5, American Chemical Society.

Jacobs, H.O. et al., "Submicrometer Patterning of Charge in Thin-Film Electrets," *Science*, 2001, pp. 1763-1766, vol. 291.

Jiang, X. et al., "Photoemission from gold thin films for application in multiphotocathode arrays for electron beam lithography," *J. Vac. Sci. Technol.*, Nov./Dec. 1998, pp. 3374-3379, vol. B16, No. 6, American Vacuum Society.

Lee, T.H. et al., "Single-Molecule LEDs from Nanoscale Electroluminescent Junctions," *Journal of Physical Chemistry B*, 2003, pp. 7383-7390, vol. 107, No. 30, American Chemical Society.

Mesquida, P. et al., "Attaching Silica Nanoparticles from Suspension onto Surface Charge Patterns Generated by a Conductive Atomic Force Microscope Tip," *Adv. Mater.*, 2001, pp. 1395-1398, vol. 13, No. 18, Wiley-VCH Verlag GmbH & Co. KGaA, Weinheim.

* cited by examiner

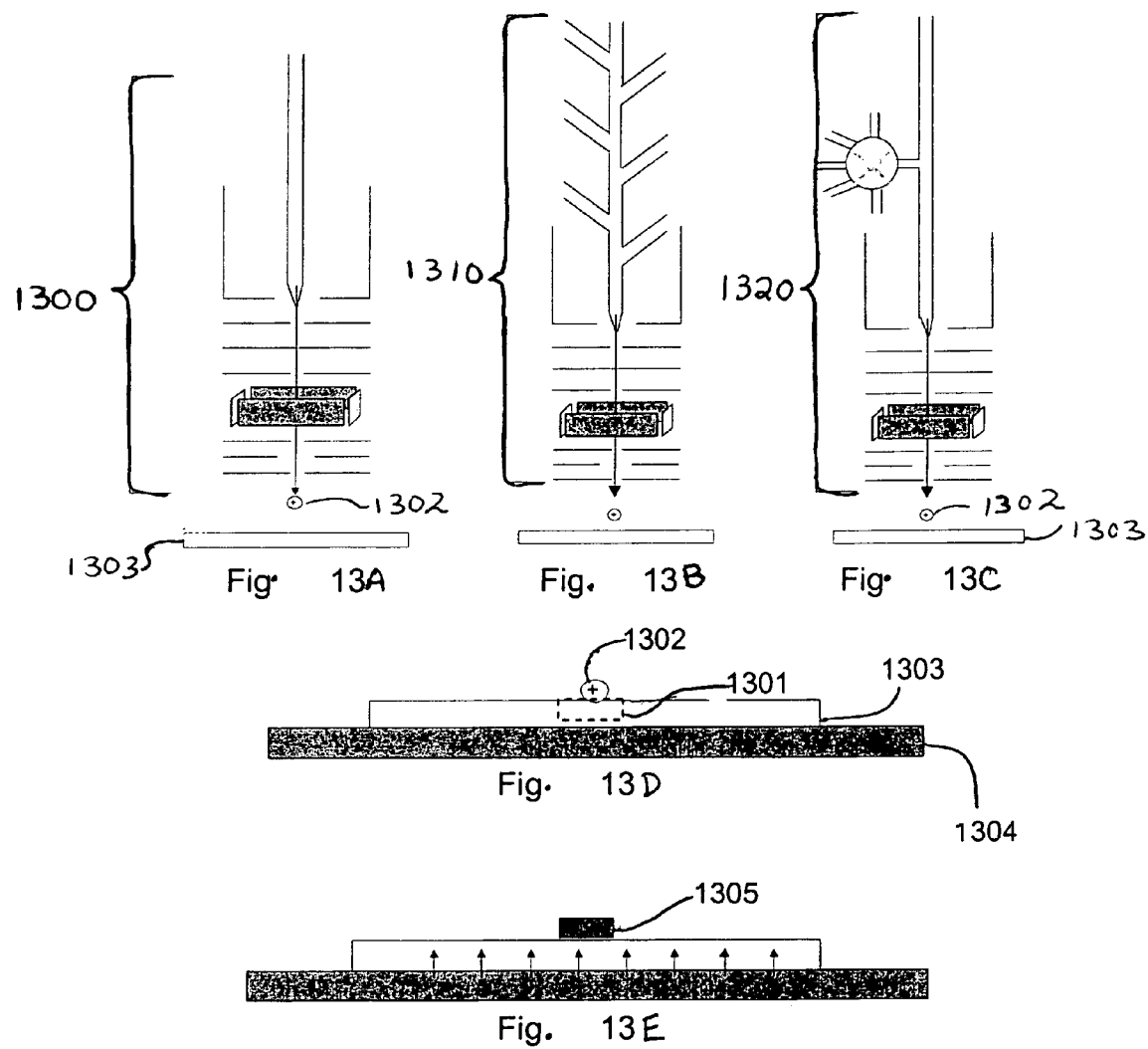

RAPID PATTERNING OF NANOSTRUCTURES

RELATED APPLICATIONS

This application claims the benefit of U.S. Provisional Application Ser. No. 60/643,254, filed Jan. 12, 2005, the entire disclosure of which is herein incorporated by reference.

This application is a continuation-in-part of co-pending U.S. patent application Ser. No. 10/444,176, filed May 23, 2003, the entire disclosure of which is herein incorporated by reference, which claims the benefit of U.S. Provisional Application Ser. No. 60/383,396, May 24, 2002.

FIELD OF THE INVENTION

This invention relates to nanolithography and, in particular, to the fabrication of two- and three-dimensional functional structures with a characteristic length scale below 100 nanometers (nm).

BACKGROUND

Nanoelectronic devices with length scales below 100 nm are of great interest for the functional semiconductor field. Theoretically, making devices with characteristic length scales less than 10 nm is possible, but it takes a long time, is hard to control, and is expensive. Existing methods for fabricating devices below 100 nm include both top down and bottom up approaches.

Conventional top down approaches using photolithography or electron beam lithography require utilization of photoresists for selective formation of desired materials into functional devices. Because of proximity effects, photolithography is limited in the resolution achievable. Because of the minimum energy required for photoresist reaction energy, electron beam lithography is limited in the speed obtainable.

Direct-write top down approaches have included atomic force microscopy (AFM), direct writing of liquids, i.e., dip pen nanolithography, and scanning tunneling microscopy (STM) writing of oxides and charge replicas. These methods suffer from slow speeds, lack of a general set of building materials for fabricating electronic components, and a constraint to two-dimensional structures.

Existing tools for creating three-dimensional structures employ, for example, electron beam and ion beam decomposition of chemical vapor precursors. Such tools have been useful in mask and chip repair and have been shown to be capable of writing three-dimensional structures. Typically, organometallic precursor gases adsorbed onto substrate surfaces are decomposed using energy supplied from incident beams, depositing the desired metal or insulator. This technique facilitates deposition of nanometer- to micrometer-size structures with nanometer precision in three dimensions, without supplementary process steps such as lift-off or etching procedures. Although successful in creating high resolution three-dimensional structures, both scanning electron microscopy (SEM) and focused ion beam (FIB) chemical vapor deposition (CVD) suffer from significant contamination by the organic components of precursor gases. Carbon contamination from typical precursor gases may exceed 50%, thus altering device conductivities to levels unacceptable for many desired applications. Device fabrication by energetic-beam CVD is also constrained by an inherently small number of available precursor gases, thus limiting the variety of materials that can be deposited. Finally, because existing processes are serial and sufficient beam energy must be applied to decompose the precursor, deposition speeds are very slow.

In typical currently-employed bottom up approaches, layers are selectively applied to, rather than removed from, a substrate. For example, nano-scaled building blocks synthesized precisely by chemistry or other methods may later be assembled by, e.g., self assembly. Presently, the complexity of logic that may be built in this way is extremely limited.

In contrast, nature is excellent at predicated assembly of complex molecules such as DNA on a scale similar to that of present-day nanostructures. Nature can make precise molecules with enzymes such as polymerase that typically have extremely low error rates by utilizing feedback and performing error correction. Direct feedback and error correction are seldom implemented in present fabrication processes, and hence the yield of functional devices is low in comparison to functional molecules formed by biological processes.

What has been needed, therefore, is a system for fabrication of two- and three-dimensional functional structures with a characteristic length scale below 100 nm that employs a precise and rapid patterning of high purity nanoscale building blocks.

SUMMARY

These and other objectives are met by the present invention, which is a process for forming nanostructures that comprises generating charged nanoparticles with an electrospray system in a vacuum chamber and introduction of the charged nanoparticles to a region proximate to a charge pattern, so that the particles adhere to the charge pattern in order to form the feature. The present invention facilitates a precise and rapid patterning of high purity nanoscale building blocks in two and three dimensions in order to build functional ultrahigh density devices. Two- or three-dimensional nanostructures may be formed by rapidly creating a charge pattern of nanoscale dimensions on a substrate using a normal electron beam or a microcolumn electron beam, generating high purity nanoscale or molecular size scale building blocks of a first type that image the charge pattern using the electrospray system, and then optionally sintering the building blocks to form the feature.

In one aspect, the present invention is a method for forming a feature, the method including forming a charge pattern on a substrate, the charge pattern having a first type of charge, and introducing nanoscale or molecular size scale building blocks using an electrospray apparatus in a vacuum chamber to a region proximate the charge pattern, the building blocks having a second type of charge and adhering to the charge pattern to form the feature. The building blocks may be any suitable material, including nanoparticles and/or organic molecules. The charge pattern may be formed with an energy beam, such as an ion beam, an electron beam, or microcolumn electron beam. The adhered nanoparticles may be globally sintered. The nanoparticles may be directed toward the substrate as a stream, such that the nanoparticles adhere only to the charge pattern. The velocity of at least a portion of the plurality of nanoparticles may be controlled by a metal plate aperture near the tip of the electrospray apparatus.

The electrospray apparatus may optionally include deflectors to allow direct deposition of charged particles onto the substrate. It may be single source or multi-source, allowing spraying of multiple types of materials either simultaneously (injection) or alternately (selection). The electron beam used to create the charge pattern may be single column, microcolumn, multi-array microcolumn, or any other suitable configuration known in the art.

BRIEF DESCRIPTION OF THE DRAWINGS

The foregoing discussion will be understood more readily from the following detailed description of the invention, when taken in conjunction with the accompanying drawings, in which like referenced features identify common features in corresponding drawings and:

FIGS. 13A-E are schematic diagrams of an embodiment of an electrospray-based nanopatterning process employing deflectors and sintering of charged nanoparticles according to one aspect of the present invention;

DETAILED DESCRIPTION

Figure 1:
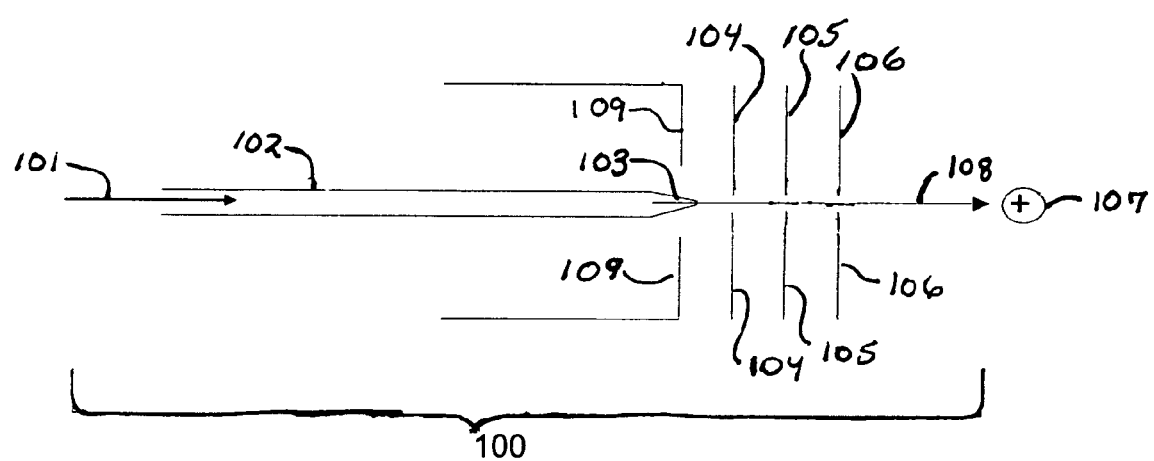
FIG. 1 is a schematic diagram of electrospray equipment for spraying charged particles into the vacuum chamber, according to one aspect of the present invention.

The present invention is a system for patterning nanoscale building blocks for use in fabrication of two- and three-dimensional functional structures with a characteristic length scale below 100 nm. In one embodiment, arbitrary three-dimensional nanostructures are formed by rapidly creating a charge pattern of nanoscale dimensions on a substrate using a normal electron beam or a microcolumn electron beam, generating high purity molecular size-scale building blocks (MSSBBs) of a first type that image the charge pattern, and then optionally sintering or otherwise changing the binding between the MSSBBs and themselves or the substrate for the purpose of forming, for example, a locally solid layer delineated by the charge pattern, or to cause the MSSBBs to become attached to the surface or other MSSBBs. In some embodiments, nanoscale building blocks (NSBBs) may be used to image the charge pattern. MSSBBs or NSBBs may be any organic or inorganic molecule, such as DNA, proteins, nucleotides, amino acids, insulating nanoparticles, semiconductor nanoparticles, metal nanoparticles, nanotubes or nanowires. In a preferred embodiment, MSSBBs are nanoparticles, which may have dimensions ranging from 1 nm to more than 100 nm. More specifically, when the charged nanoparticles are introduced in proximity to the charge pattern, the nanoparticles are attracted to the pattern, thereby "imaging" the charge pattern.

In one embodiment of the present invention, positively charged nanoparticles induced by electrospray are attracted to the negative charge on a surface of the substrate. Negatively charged nanoparticles induced by electrospray are attracted to the positive charge on a surface of the substrate. The process may be repeated with nanoparticles of a second type to create arbitrary three-dimensional nanostructures. In addition to charged inorganic nanoparticles, organic molecules that have an affinity for a charge pattern or which themselves can be charged by the electrospray voltage control system, and thus have an affinity for a charge pattern, may also be similarly patterned. The charge pattern may be created and represented digitally, or it may be used to control the action of an electron beam or microcolumn electron beam.

An alternative approach to creating arbitrary three-dimensional nanostructures of high purity involves directly spraying charged nanoparticles using an electrospray apparatus with a short column optic system and deflectors, and then sintering the particles via an additional global heating source to form a locally solid layer delineated by the charge pattern. The short column optic system focuses charged nanoparticles to the desired point and the deflectors of the electrospray move the point of spray into the specified place.

Among the many applications of the present invention, it may be used to create electronic structures in order to place additional components on a pre-existing semiconductor chip made by conventional methods. This process is highly versatile in comparison to existing technologies because of the wide variety of materials that may be sprayed in order to form charged nanoparticles, including, but not limited to, metals, inorganic semiconductors, insulators, DNA, proteins, nanotubes, and nanowires. Nanosize materials can be dispersed in any solvent, such as a polar solvent or nonpolar solvent, which has a certain vapor pressure, so that a large class of materials can be sprayed in order to produce nanosize particles with positive or negative charges.

In some embodiments, a patterning method using an electrospray system may provide a higher resolution and faster throughput than the conventional photolithography method employing photoresists. The conventional method has a limit of resolution that is 5 nm to several hundred nm, depending on the thickness of the photoresists. Using an electron beam to pattern the photoresist may enhance the resolution, but it decreases the process speed. However, patterning particles using electrospray does not require use of photoresists. Moreover, a low dosage of electron beam is enough to put the charge on the substrate, since it does not require any chemical reaction, thereby contributing to the enhancement of process speed.

In alternative embodiments, other patterning methods are possible which may give higher resolution. For example, instead of patterning only negative charges with a normal electron beam or a microcolumn electron beam, negative charges as well as positive charges may be patterned in distinct areas using a dual-beam, scanning electron, and/or focused ion beam source.

FIG. 1 is a schematic diagram of electrospray equipment for spraying charged particles into a vacuum chamber, according to one aspect of the present invention. In FIG. 1, charged nanoscale particle 107 is dispersed from electrospray equipment 100. Solution 101 of particles and solvent is propelled through sharp needle 102 by the effect of a voltage differential between tip 103 of needle 102 and plate 104. Solution 101 can be made of any particle, such as, for example, insulating nanoparticles, semiconductor nanoparticles, metal nanoparticles, DNA, proteins, nanotubes, nanowires, and polar or nonpolar solvents. In some embodiments, sharp needle 102 may be made of High Performance Liquid Chromatography (HPLC) column, drawn glass tubes, fused silica, or any other suitable material or construction known in the art. Metal plate 109 provides high voltage at tip 103 of inlet needle 102. This voltage can be positive or negative. Positive voltage at tip 103 induces a positive liquid nanosize particle 107 and negative voltage at tip 103 induces a negative liquid nanosize particle. Metal plate 104 has lower voltage than plate 109, driving movement of particle 107 in specific direction 108 through the action of the resulting electric field. Metal plates 105 and 106 also have voltages on them, focusing liquid nanoparticles 107 to a single point.

Metal plates 104, 105, 106 may have either positive or negative voltages, depending on the voltage given to plate 109. Nanoparticles 107 coming through electrospray system 100 will typically be of a size ranging from 1 nm to more than 100 nm.

The velocity of the nanoparticles may be controlled. The velocity of at least a portion of the plurality of nanoparticles may be reduced in the region proximate the charge pattern. The velocity of at least a portion of the plurality of nanoparticles may be controlled by an electric field that may be alternating. The velocity of at least a portion of the plurality of nanoparticles may be controlled by a magnetic field that may be alternating. In a preferred embodiment, the velocity of at least a portion of the plurality of nanoparticles is controlled by a metal plate aperture near the tip of the electrospray apparatus.

Figure 2:
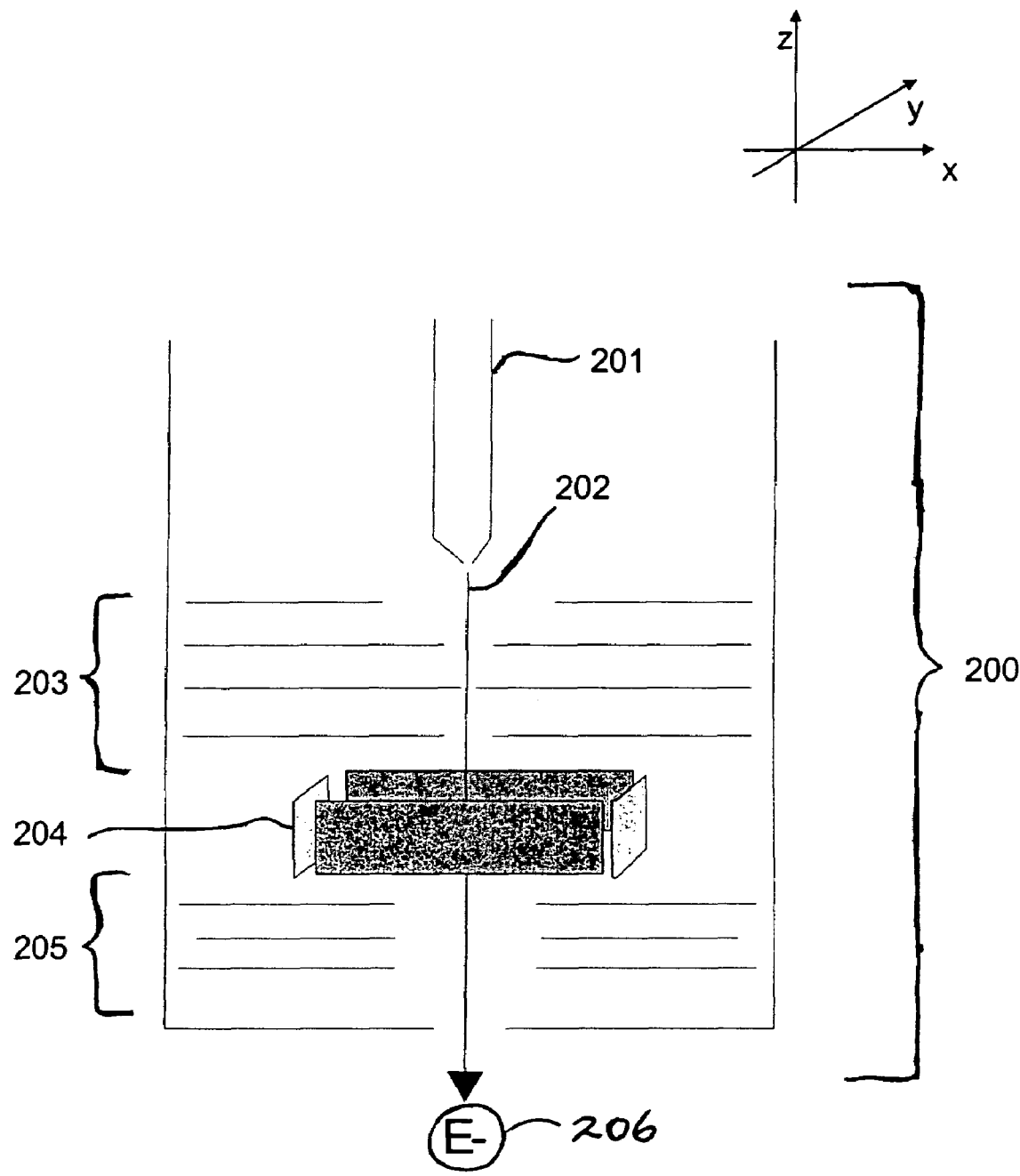
FIG. 2 is a schematic diagram of microcolumn electron beam equipment for generating a low voltage e-beam, according to one aspect of the present invention.

FIG. 2 is a schematic diagram of microcolumn electron beam equipment for generating a low voltage e-beam, according to one aspect of the present invention. In FIG. 2, low energy electron beam 206 is emitted from microcolumn electron beam equipment 200. Electron emitter 201 may be a low power Schottky emitter generating electrons by thermionic emission, a field induced emitter generating electrons by high voltage at the tungsten tip or a tip-attaching carbon nanotube, or any other such device known in the art. Emitted electron beam 202 is focused by extractor, anode, and aperture plates 203 by controlling the voltage. In some embodiments, plates 203 may be made of silicon substrate with pyrex spacer using anodic bonding technique, of other insulating material such as Teflon, or of ceramic.

Deflectors 204 change the trajectory of the electron beam through the action of the electric field. For example, an electric field created in the X direction by a voltage difference in a silicon plate with metal wire induces the path of electron beam 202 to move in the X direction. Similarly, an electric field created in the Y direction by a voltage difference in a specific silicon plate with metal wire induces the path of electron beam 202 to move in the Y direction. In some embodiments, deflectors 204 may be comprised of more than four plates (for example, eight plates), in order to provide more precise control of the electron beam. In other embodiments, deflectors 204 may comprise two pairs in the Z direction that induce a beam path normal to the substrate, even though the desired target of the beam is not at the center of the tip. Electrostatic lenses 205 focus electron beam 202 and select particular electron beams by means of negatively applied voltage at lens 205. Electrons 206 coming out of microcolumn electron beam system 200 have a low energy, ranging from lower than 10 eV to 1 KeV. This low energy of the emitted electrons may enhance the resolution of charged pattern, because a low energy electron cannot disperse widely when being attached to the surface.

Figure 3:
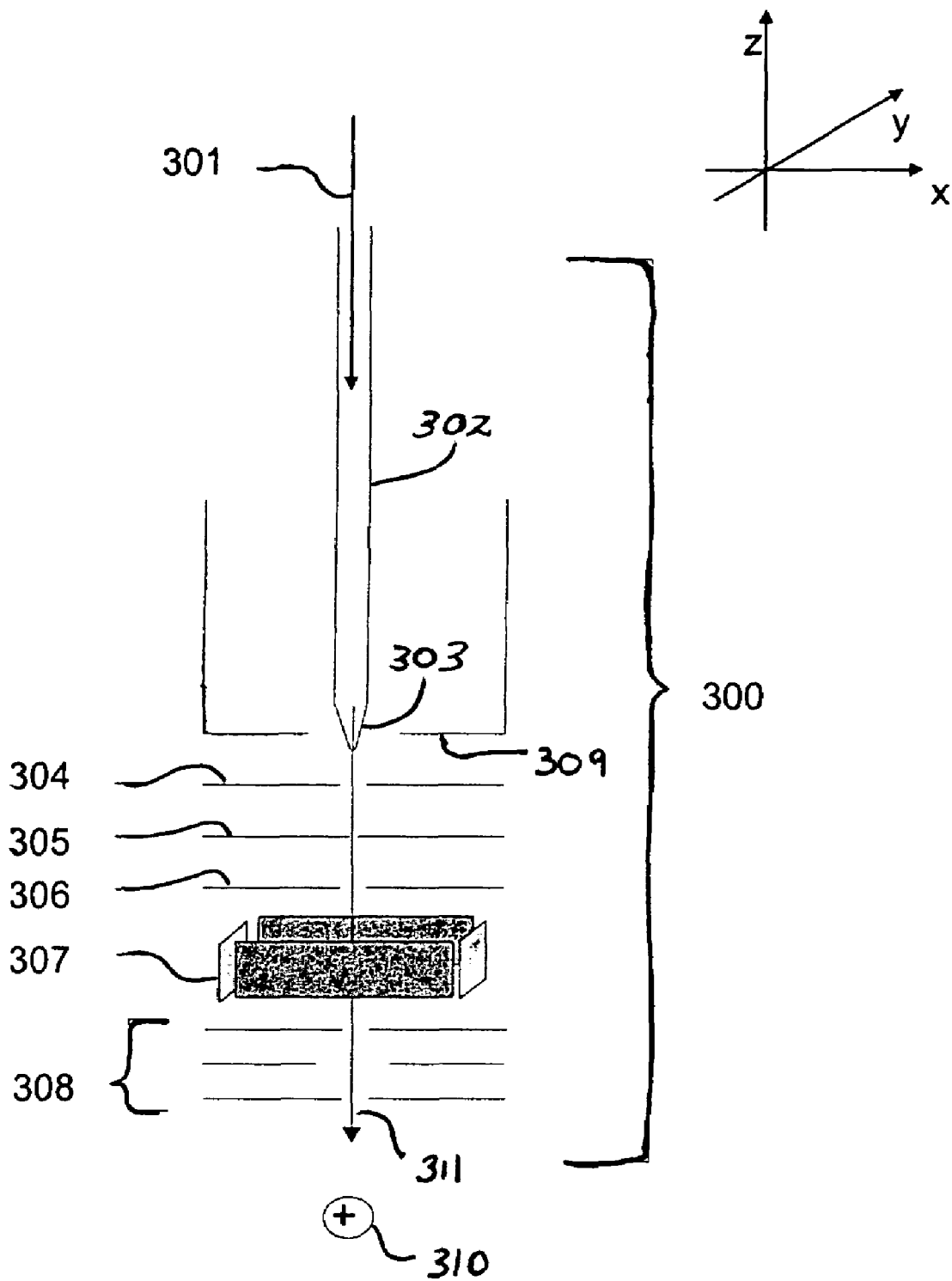
FIG. 3 is a schematic diagram of electrospray equipment with deflectors for direct deposition of charged particles onto the substrate, according to one aspect of the present invention.

FIG. 3 is a schematic diagram of electrospray equipment with deflectors, used for direct deposition of charged particles onto the substrate according to one aspect of the present invention. In FIG. 3, charged nanoscale particle 301 is emitted from electrospray equipment 300 having deflectors 307. Solution 301 of particles and solvent is propelled through sharp needle 302 by the effect of a voltage differential between tip 303 of needle 302 and plate 304. Solution 301 can be made of any particle such as, for example, insulating nanoparticles, semiconductor nanoparticles, metal nanoparticles, DNA, proteins, nanotubes, nanowires, and polar or nonpolar solvents. In some embodiments, sharp needle 302 may be made of High Performance Liquid Chromatography (HPLC) column, drawn glass tubes, or fused silica. Metal plate 309 provides a high voltage at tip 303 of inlet needle 302. This voltage can be positive or negative. A positive voltage of the tip induces a positive liquid nanosize particle 310, whereas a negative voltage of the tip induces a negative liquid nanosize particle. Metal plate 304 has lower voltage than plate 309, generating the movement of particle in specific direction 311 by action of the electric field. Metal plates 305 and 306 also have voltages on them, focusing the liquid nanoparticles to a single point. The voltages on metal plates 304, 305, 306 may be positive or negative, depending on the voltage provided at plate 309. Deflectors 307 operate to change the trajectory of positively or negatively charged nanoparticles by action of the electric field. In some embodiments, deflectors 307 may have more than four plates for more precise control of the charged nanoparticles. In other embodiments, deflectors 307 may comprise two pairs in the Z direction that induce a beam path normal to the, even though the desired target of the beam is not at the center of tip 303. Electrostatic lenses 308 focus deflected nanoparticles with positive or negative charges through positively or negatively applied voltage in lenses 308. Nanoparticles 310 coming through electrospray apparatus 300 will typically range in size from 1 nm to more than 100 nm.

Figure 4A:
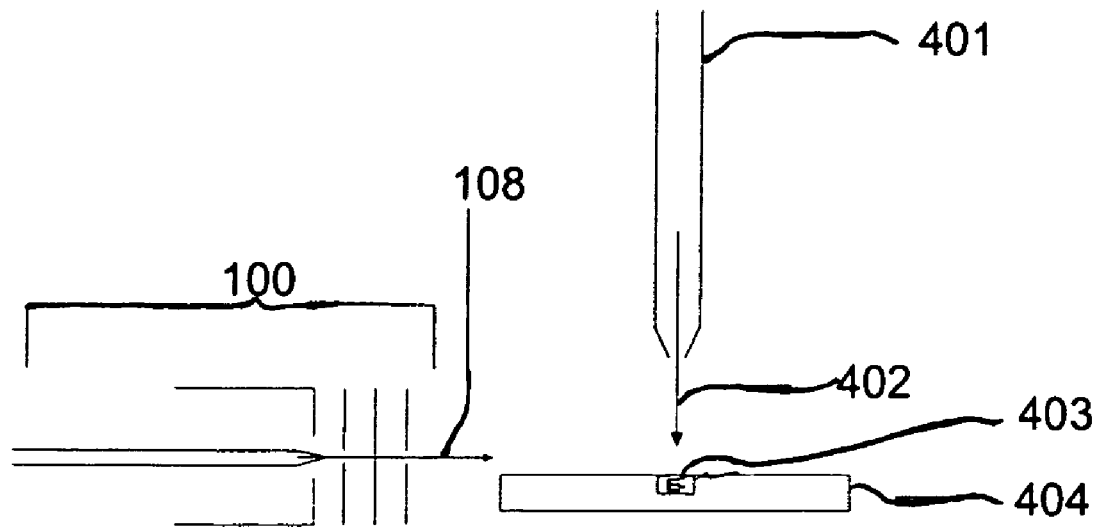
FIGS. 4A-D are schematic diagrams of an embodiment of an electron beam-based nanopatterning process utilizing electrospray equipment with sintering of charged nanoparticles, according to one aspect of the present invention.

FIGS. 4A-D are schematic diagrams of an embodiment of an electron beam-based nanopatterning process utilizing electrospray equipment with sintering of charged nanoparticles, according to one aspect of the present invention. In FIGS. 4A-D, single electron beam 402 is simultaneously incident in parallel on substrate 404, thereby developing charge pattern 403. Electron beam 402 may be used for the fabrication of features having nanoscale dimensions. In some embodiments, electron beam 402 may be an ion beam or a photon beam. Electron beam 402 may have a first type of charge, i.e., a negative charge, and is generated by electron beam source 401. Electron beam source 401 may be any suitable source known in the art, such as, for example, an environmental scanning electron microscope (ESEM) such as the XL-30 ESEM-FEG manufactured by FEI Company, Hillsboro, Oreg. Electron beam 402 may optionally be deflected by electrostatic steering plates. Electron beam 402 writes charge pattern 403, also referred to as a charge replica, onto substrate 404. In the embodiment of FIG. 4A, the pattern is negatively charged.

Substrate 404 may be formed of any suitable material known in the art, such as, for example, an electret, i.e. a dielectric material capable of storing charge, such as mylar, poly(methylmethacrylate), $SiO_2$, or $CaTiO_3$. Substrate 404 may be obtained from, for example, Goodfellow Corporation, based in Pennsylvania. In some embodiments, an ion beam [see, e.g., Fudouzi et al., *Adv. Mater* 14 1649 (2002), using a 30 keV $Ga^+$ ion beam to write positively charged patterns in $CaTiO_3$], an atomic force microscope (AFM) writing head [see, e.g., P. Mesquida and A. Stemmer, *Adv. Mater.* 13 1397 (2001), inducing negative or positive charge patterns in poly (tetra-fluoroethylene) (PTFE) by applying voltage pulses of ±15-20V to the tip], microcontact stamping of charge [see, e.g., H. O. Jacobs and G. M. Whitesides, *Science* 291 1763 (2001), submicron trapping of charge in thin layers of PMMA on n-doped silicon by applying 10-20 V between the conductive silicon support and a patterned gold-coated poly (dimethylsiloxane) stamp], or any suitable device known in the art may be used to generate charge pattern 203.

Figure 4B:
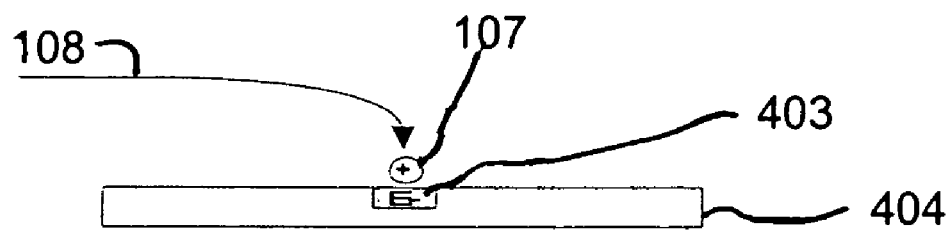
Figure 4C:
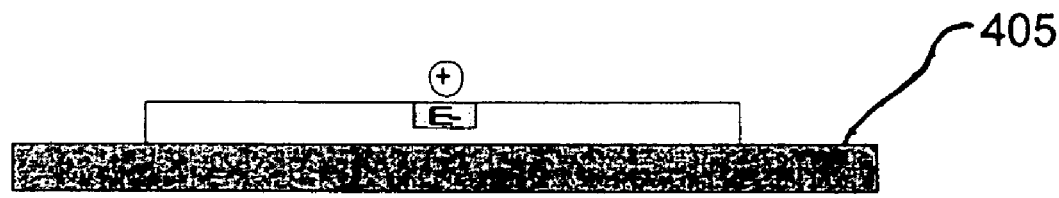
Figure 4D:
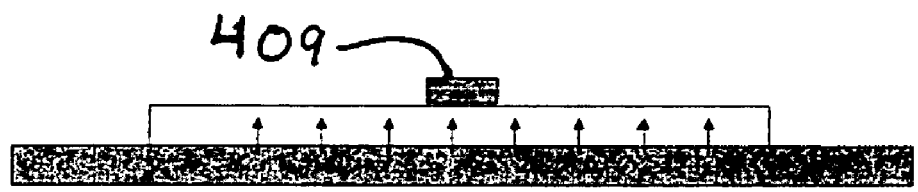

In FIG. 4A, inside a vacuum chamber ranging from $1.0*10-4$ mbarr to more than $1.0*10-7$ mbarr, electrospray system 100 generates positively or negatively charged liquid nanosize particles 107 in direction 108 of charge pattern 403. In FIG. 4B, a plurality of positively charged nanosize particles 107 deposit onto a surface of substrate 404 and arrange themselves on charge pattern 403. In FIG. 4C, global heating source 405 heats substrate 404, thereby sintering nanoparticles 107 to form continuous structure 409 (FIG. 4D) that includes nanoparticles 107 without any solvents. Global heating source 405 may be any suitable device known in the art, such as, for example, a hot plate or a laser. An advantage of this process of the present invention is that it may be scaled up to many thousands of beams or more, and therefore the fabrication speed may be increased by many orders of magnitude.

FIGS. 5A-D are schematic diagrams of an embodiment of an electron beam-based nanopatterning process employing multi-source injection electrospray equipment and sintering of charged nanoparticles according to another aspect of the present invention. In FIGS. 5A-D, single electron beam 402 is simultaneously incident in parallel on substrate 404, thereby developing charge pattern 403. Electron beam 402 may be used for the fabrication of features having nanoscale dimensions. As mentioned above for FIGS. 4A-D, charge pattern 403 may be established by any of the several methods known in the art, such as, for example, electron beam or ion beam. Electron beam 402 may be optionally deflected by electrostatic steering plates. Electron beam 402 writes charge pattern 403 onto substrate 404. In the embodiment shown in FIG. 5A, the pattern is negatively charged.

Figure 5A:
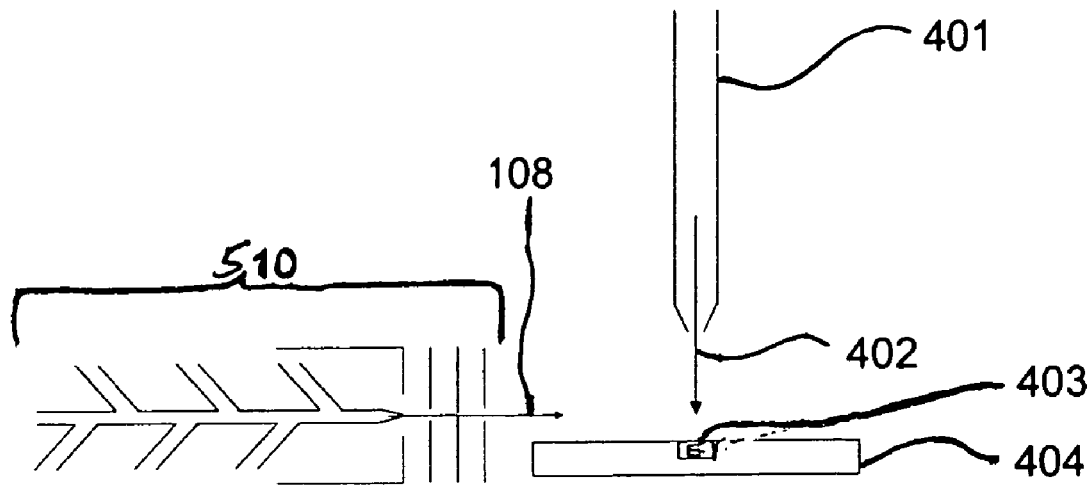
FIGS. 5A-D are schematic diagrams of an embodiment of an electron beam-based nanopatterning process utilizing multi-source injection electrospray equipment with sintering of charged nanoparticles, according to another aspect of the present invention.
Figure 5B:
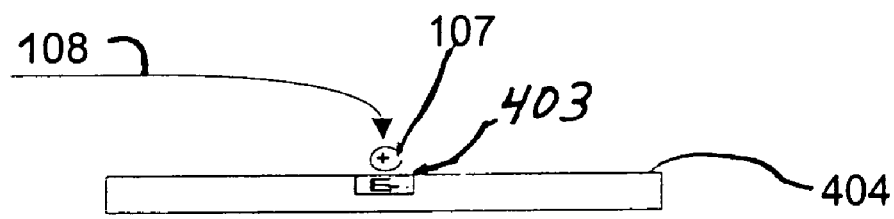
Figure 5C:
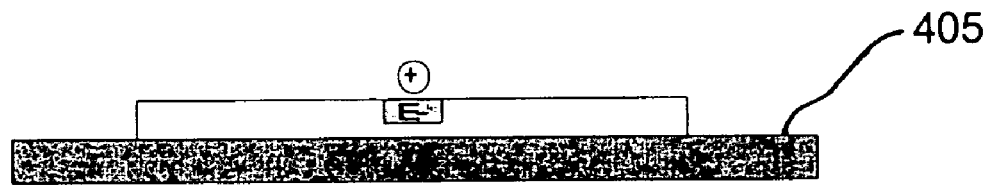
Figure 5D:
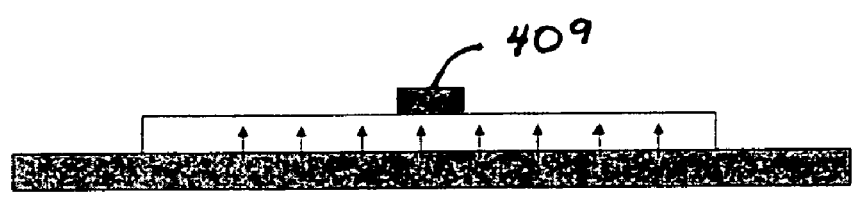

Substrate 404 may be formed of, for example, an electret. In FIG. 5A, inside a vacuum chamber ranging from $1.0*10-4$ mbarr to more than $1.0*10-7$ mbarr, multi-source electrospray system 510 generates positively or negatively charged liquid nanosize particles 107 in direction 108 of charge pattern 403. Multi-source inlet electrospray system 510 may spray several different materials, depending on the spray needle design. For purity reasons, one or more of the inlet tubes may contain solvent that cleans the path of solution. In FIG. 5B, a plurality of positively charged nanosize particles 107 deposit onto the surface of substrate 404 and arrange themselves on charge pattern 403. Because of the multiple inlet electrospray system, several materials, such as insulator, semiconductor, or metal materials, can image a pattern on the same plate without the need to take substrate 404 out of the vacuum chamber. In FIG. 5C, global heating source 405 heats substrate 404, thereby sintering nanoparticles 107 to form continuous structure 409 (FIG. 5D) that includes nanoparticles 107 without any solvents. Global heating source 405 may be any suitable device known in the art, such as, for example, a hot plate or a laser.

FIGS. 6A-D are schematic diagrams of an embodiment of an electron beam-based nanopatterning process employing multi-source selection electrospray equipment and sintering of charged nanoparticles, according to yet another aspect of the present invention. In FIGS. 6A-D, single electron beam 402 is simultaneously incident in parallel on substrate 404, thereby developing charge pattern 403. Electron beam 402 may be used for the fabrication of features having nanoscale dimensions. Charge pattern 403 may be produced by any of several methods known in the art, such as, but not limited to, electron beam or ion beam. Electron beam 402 may optionally be deflected by electrostatic steering plates. Electron beam 402 writes charge pattern 403 onto substrate 404. In the embodiment shown in FIG. 6A, the pattern is negatively charged. Substrate 404 may be formed of, for example, an electret.

Figure 6A:
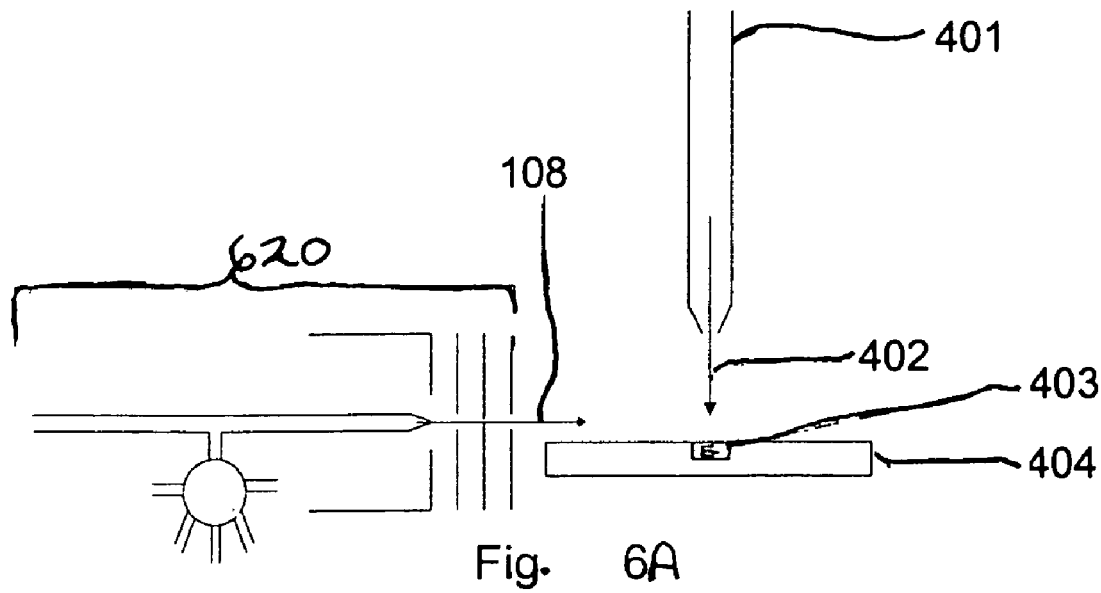
FIGS. 6A-D are schematic diagrams of an embodiment of an electron beam-based nanopatterning process utilizing multi-source selection electrospray equipment with sintering of charged nanoparticles, according to yet another aspect of the present invention.
Figure 6B:
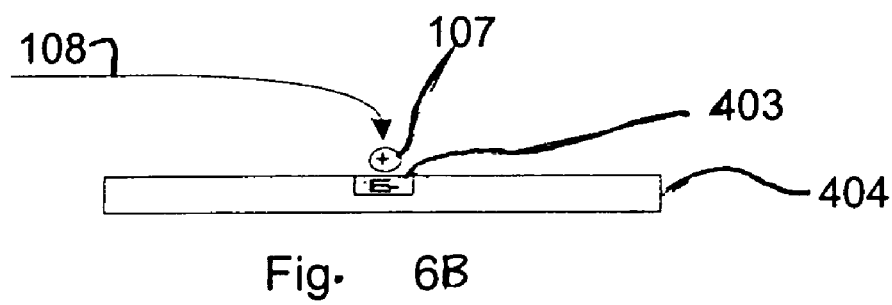
Figure 6C:
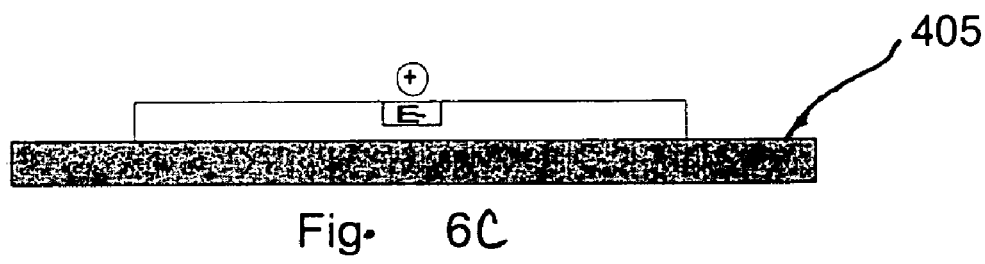
Figure 6D:
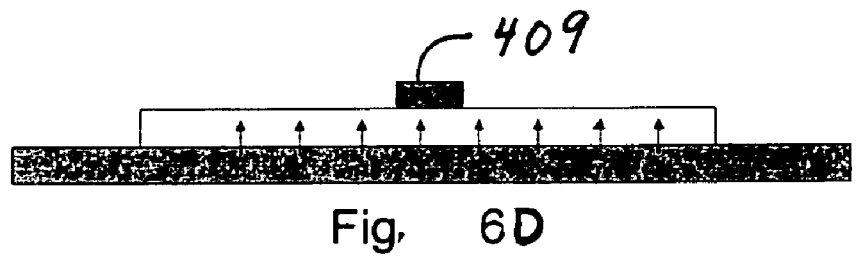

In FIG. 6A, inside a vacuum chamber ranging from $1.0*10-4$ mbarr to more than $1.0*10-7$ mbarr, multi-source selection electrospray system 620 generates positively or negatively charged liquid nanosize particles 107 in direction 108 of charge pattern 403. Multi-source selection electrospray system 620 may spray several materials, depending on the spray needle design. For purity reasons, one or more of the inlet tubes may contain solvent that cleans the path of solution. In FIG. 6B, a plurality of positively charged nanosize particles 107 deposit onto the surface of substrate 404 and arrange themselves on charge pattern 403. Because of the multi-source selection electrospray system, several materials, such as, for example, insulator, semiconductor, or metal materials, can image a pattern on the same plate without taking substrate 404 out of the vacuum chamber. In FIG. 6C, global heating source 405 heats substrate 404, thereby sintering nanoparticles 107 to form continuous structure 409 (FIG. 6D) that includes nanoparticles 107 without any solvents.

Figure 7A:
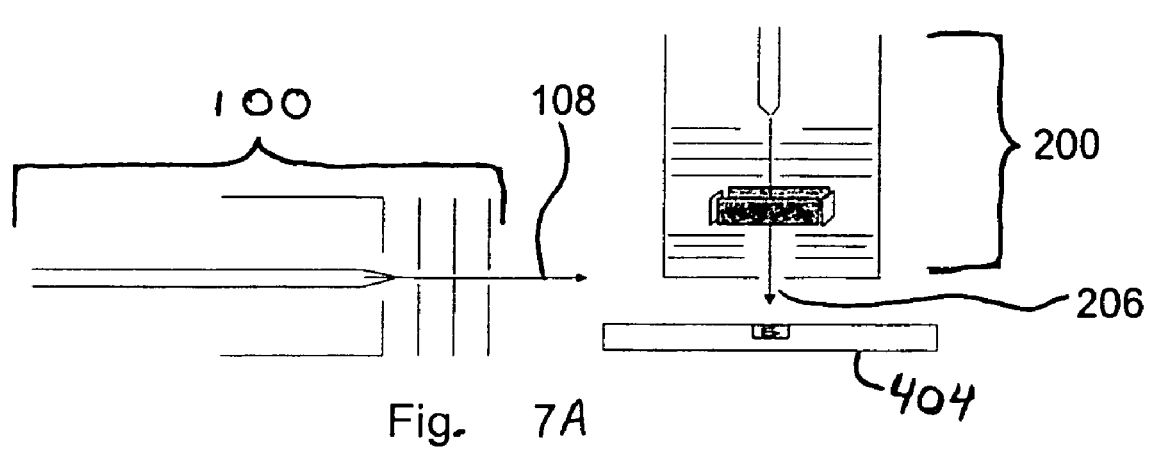
FIGS. 7A-D are schematic diagrams of an embodiment of a microcolumn electron beam-based nanopatterning process utilizing electrospray equipment with sintering of charged nanoparticles according to one aspect of the present invention.
Figure 7B:
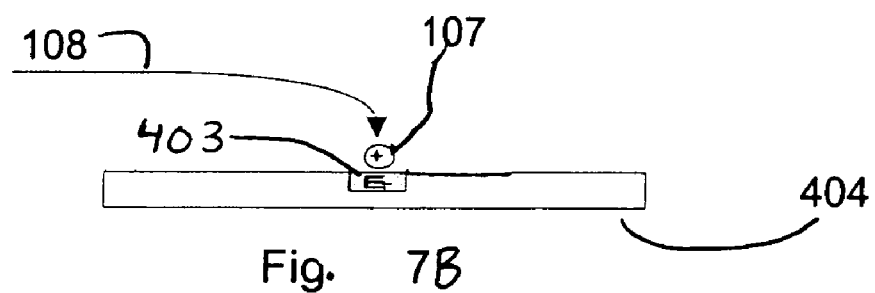
Figure 7C:
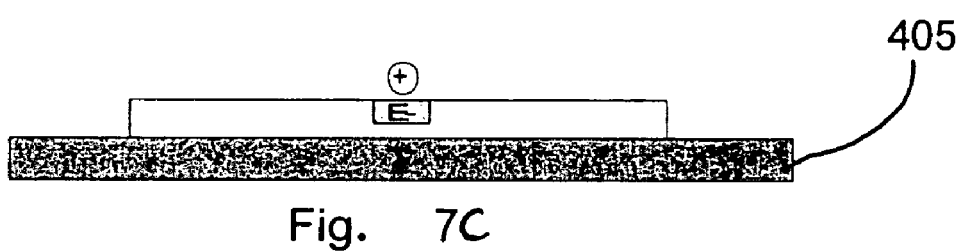
Figure 7D:
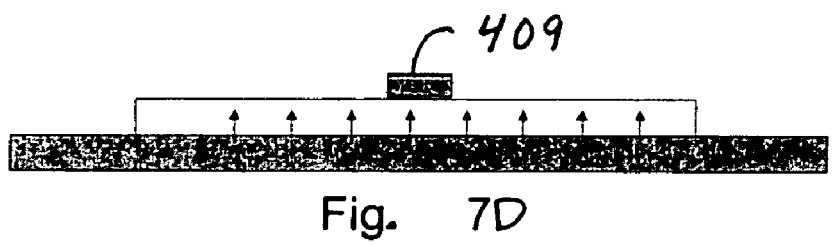

FIGS. 7A-D are schematic diagrams of an embodiment of a microcolumn electron beam-based nanopatterning process utilizing electrospray equipment and sintering of charged nanoparticles, according to one aspect of the present invention. In FIGS. 7A-D, single microcolumn electron beam system 200 generates electron beam 206 simultaneously incident in parallel on substrate 404, thereby developing charge pattern 403. Electron beam 206 may be used for the fabrication of features having nanoscale dimensions. Electron beam 206 may optionally be deflected by electrostatic steering plates. Electron beam 206 writes charge pattern 403 onto substrate 404. In the embodiment shown in FIG. 7A, the pattern is negatively charged. Substrate 404 may be formed of, for example, an electret. Inside a vacuum chamber ranging from $1.0*10-4$ mbarr to more than $1.0*10-7$ mbarr, electrospray system 100 generates positively or negatively charged liquid nanosize particles 107 in direction 108 of charge pattern 403. As seen in FIG. 7B, a plurality of positively charged nanosize particles 107 deposit onto the surface of substrate 404 and arrange themselves on charge pattern 403. In FIG. 7C, global heating source 405 heats substrate 404, thereby sintering the nanoparticles 107 to form continuous structure 409 (FIG. 7D) that includes nanoparticles 107 without any solvents.

FIGS. 8A-D are schematic diagrams of an embodiment of a microcolumn electron beam-based nanopatterning process employing multi-source injection electrospray equipment and sintering of charged nanoparticles, according to another aspect of the present invention. In FIGS. 8A-D, single microcolumn electron beam system 200 generates electron beam 206 simultaneously incident in parallel on substrate 404, thereby developing charge pattern 403. Electron beam 206 may be used for the fabrication of features having nanoscale dimensions. Electron beam 206 may optionally be deflected by electrostatic steering plates. Electron beam 206 writes charge pattern 403 onto substrate 404. In the embodiment shown in FIG. 8A, the pattern is negatively charged. Substrate 404 may be formed of, for example, an electret.

Figure 8A:
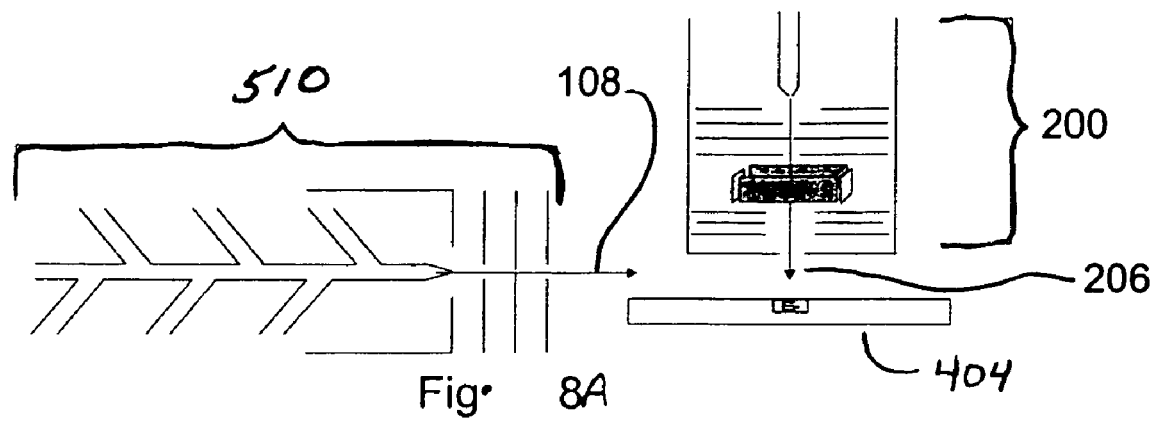
FIGS. 8A-D are schematic diagrams of an embodiment of a microcolumn electron beam-based nanopatterning process utilizing multi-source injection electrospray equipment with sintering of charged nanoparticles according to another aspect of the present invention.
Figure 8B:
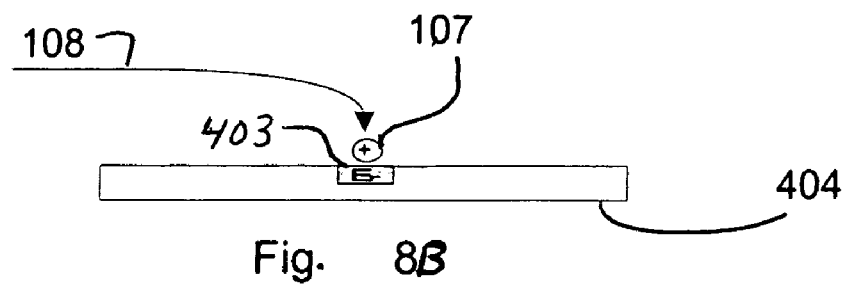
Figure 8C:
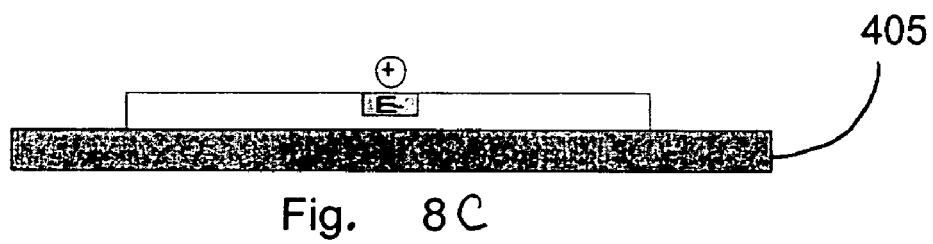
Figure 8D:
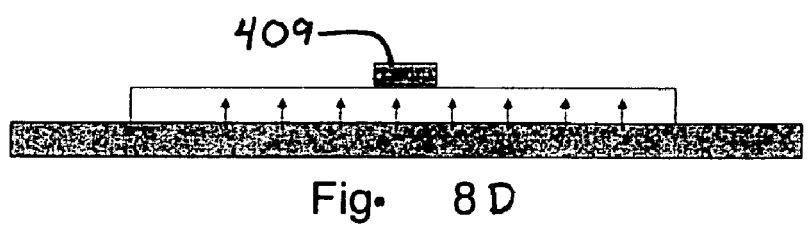

In FIG. 8A, inside a vacuum chamber ranging from $1.0*10-4$ mbarr to more than $1.0*10-7$ mbarr, multi-source electrospray system 510 generates positively or negatively charged liquid nanosize particles 107 in direction 108 of charge pattern 403. Multisource inlet electrospray system 510 may spray several materials, depending on the spray needle design. For purity reasons, one of the inlet tubes may contain solvent that cleans the path of solution. In FIG. 8B, a plurality of positively charged nanosize particles 107 deposit onto the surface of substrate 404 and arrange themselves on charge pattern 403. Because of the multiple inlet electrospray system 510, several materials, such as insulator, semiconductor, or metal materials, can image pattern 403 on the same plate without taking substrate 404 out of the vacuum chamber. In FIG. 8C, global heating source 405 heats substrate 404, thereby sintering nanoparticles 107 to form continuous structure 409 (FIG. 8D) that includes nanoparticles 107 without any solvents.

FIGS. 9A-D are schematic diagrams of an embodiment of a microcolumn electron beam-based nanopatterning process employs multi-source selection electrospray equipment and sintering of charged nanoparticles, according to yet another aspect of the present invention. In FIGS. 9A-D, single microcolumn electron beam system 200 generates electron beam 206 simultaneously incident in parallel on substrate 404, thereby developing charge pattern 403. Electron beam 206 may be used for the fabrication of features having nanoscale dimensions and may optionally be deflected by electrostatic steering plates. Electron beam 206 writes charge pattern 403 onto substrate 404. In the embodiment shown in FIG. 9A, the pattern is negatively charged. Substrate 404 may be formed of, for example, an electret.

Figure 9A:
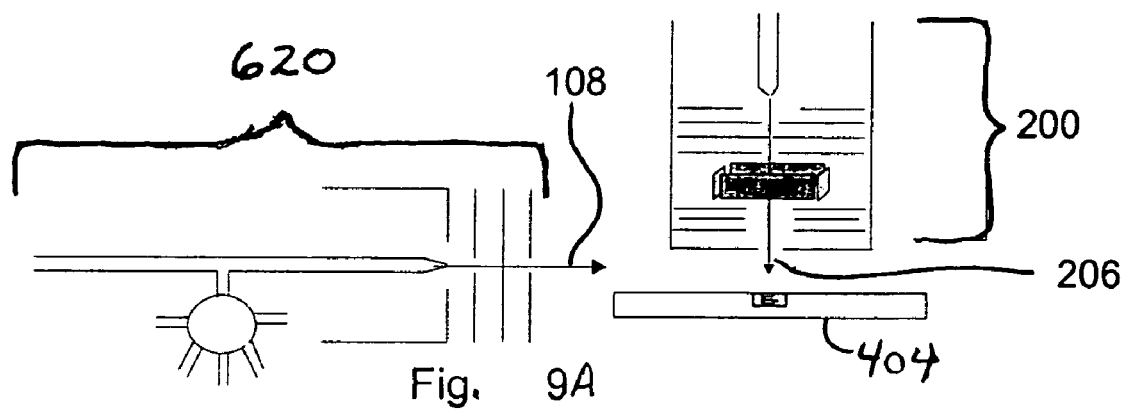
FIGS. 9A-D are schematic diagrams of an embodiment of a microcolumn electron beam-based nanopatterning process utilizing multi-source selection electrospray equipment with sintering of charged nanoparticles according to yet another aspect of the present invention.
Figure 9B:
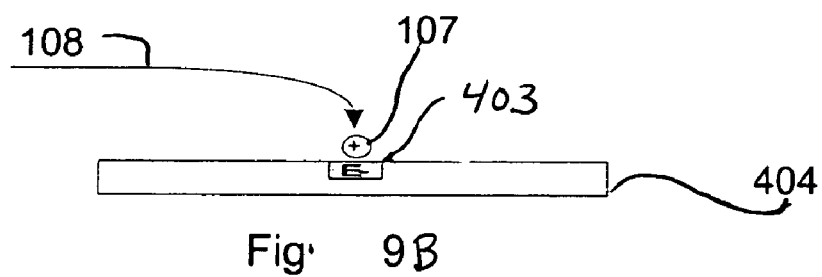
Figure 9C:
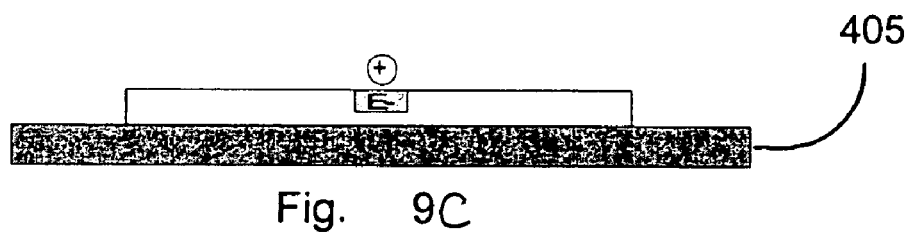
Figure 9D:
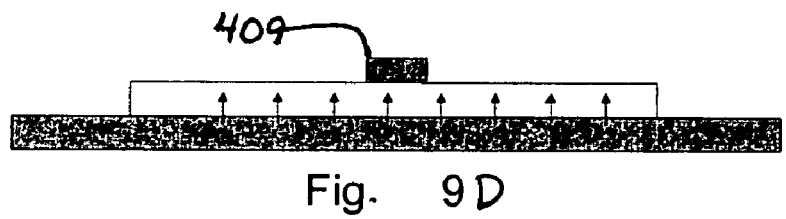

In FIG. 9A, inside a vacuum chamber ranging from $1.0*10-4$ mbarr to more than $1.0*10-7$ mbarr, multi-source selection electrospray system 620 generates positively or negatively charged liquid nanosize particles 107 in direction 108 of charge pattern 403. Multi-source selection electrospray system 620 may spray several materials, depending on the spray needle design. For purity reasons, one or more of the inlet tubes may contain solvent that cleans the path of solution. In FIG. 9B, a plurality of positively charged nanosize particles 107 deposit onto the surface of substrate 404 and arrange themselves on charge pattern 403. Because of the multi-source selection electrospray system 620, several materials, such as insulator, semiconductor, or metal materials, can image pattern 403 on the same plate without taking substrate 404 out of the vacuum chamber. In FIG. 9C, global heating source 405 heats substrate 404, thereby sintering nanoparticles 107 to form continuous structure 409 (FIG. 9D) that includes nanoparticles 107 without any solvents.

FIGS. 10A-D are schematic diagrams of an embodiment of a multi-array microcolumn electron beam-based nanopatterning process employing electrospray equipment and sintering of charged nanoparticles according to one aspect of the present invention. In FIGS. 10A-D, multi-microcolumn electron beam system 1010 generates array of electron beams 1001 simultaneously incident in parallel on substrate 1003, thereby developing charge pattern 1002. Charge pattern 1002 is thus created in a single step, rather than by the scanning of a single beam across entire substrate 1003 multiple times. Array of electron beams 1001 may be used for the fabrication of features having nanoscale dimensions. Array of electron beams 1001 may be optionally deflected by electrostatic steering plates. Array of electron beams 1001 writes charge pattern 1002 onto substrate 1003. In the embodiment shown in FIG. 10A, the pattern is negatively charged. Substrate 1003 may be formed of any suitable material known in the art, such as, for example, an electret, i.e., a dielectric material capable of storing charge.

Figure 10A:
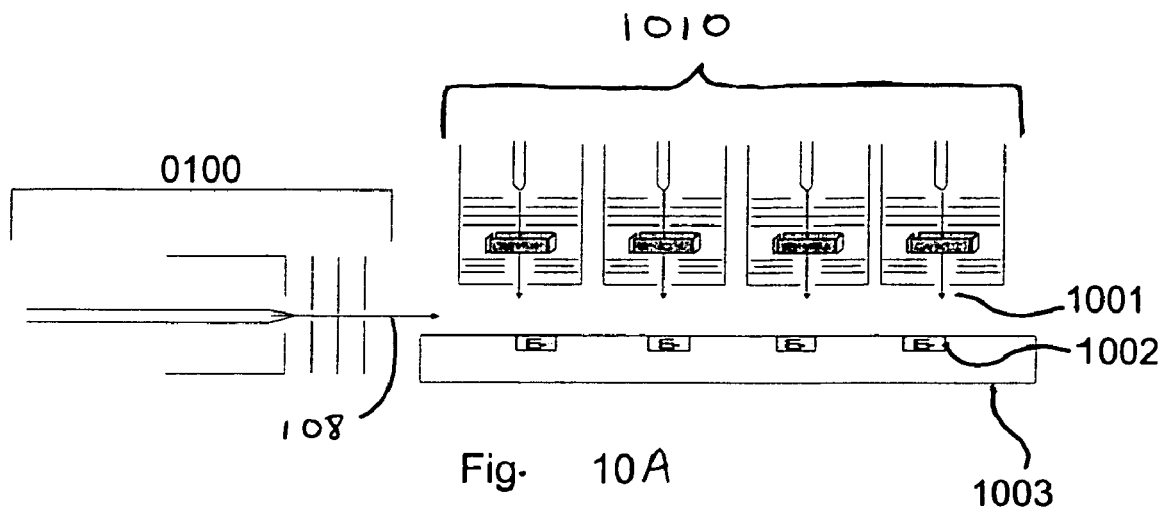
FIGS. 10A-D are schematic diagrams of an embodiment of a multi-array microcolumn electron beam-based nanopatterning process utilizing electrospray equipment with sintering of charged nanoparticles according to one aspect of the present invention.
Figure 10B:
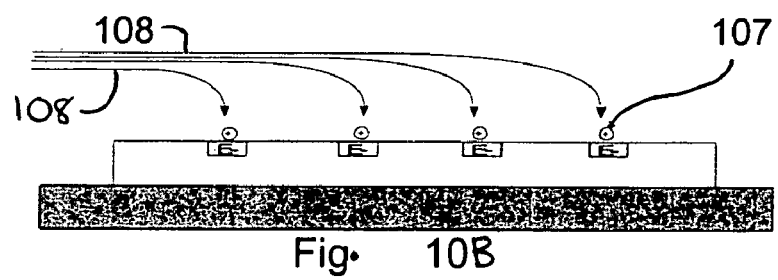
Figure 10C:
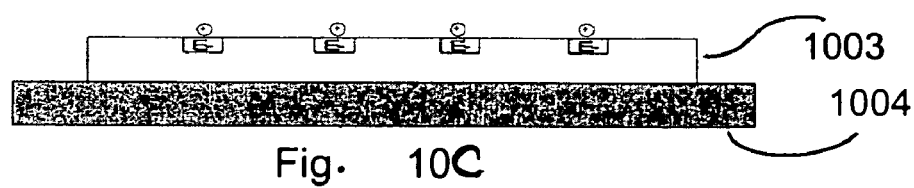
Figure 10D:
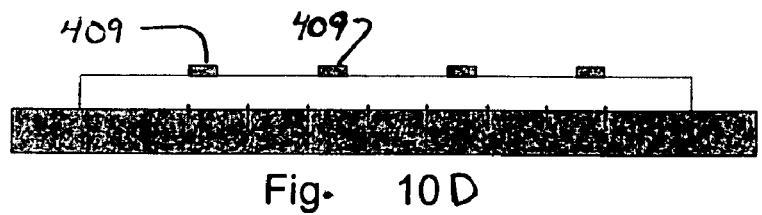

In FIG. 10A, inside a vacuum chamber ranging from $1.0*10-4$ mbarr to more than $1.0*10-7$ mbarr, electrospray system 100 generates positively or negatively charged liquid nanosize particles 107 in direction 108 of charge pattern 1002. In FIG. 10B, a plurality of positively charged nanosize particles 0107 deposit onto the surface of substrate 1003 and arrange themselves on charge pattern 1002. In FIG. 10C, global heating source 1004 heats substrate 1003, thereby sintering nanoparticles 107 to form continuous structure 409 (FIG. 10D) that includes nanoparticles 107 without any solvents. Global heating source 1004 may be any suitable device known in the art, such as, for example, a hot plate or a laser.

FIGS. 11A-D are schematic diagrams of an embodiment of a multi-array microcolumn electron beam-based nanopatterning process employing multi-source injection electrospray equipment and sintering of charged nanoparticles, according to another aspect of the present invention. In FIGS. 11A-D, multi-microcolumn electron beam system 1010 generates array of electron beams 1101 simultaneously incident in parallel on substrate 1103, thereby developing charge pattern 1102. Charge pattern 1102 is thus created in a single step rather than by the scanning of a single beam across entire substrate 1103 multiple times. Array of electron beams 1101 may be used for the fabrication of features having nanoscale dimensions. Array of electron beams 1101 may optionally be deflected by electrostatic steering plates. Array of electron beams 1101 writes charge pattern 1102 onto substrate 1103. In the embodiment shown in FIG. 11A, the pattern is negatively charged. Substrate 1103 may be formed of, for example, an electret.

Figure 11A:
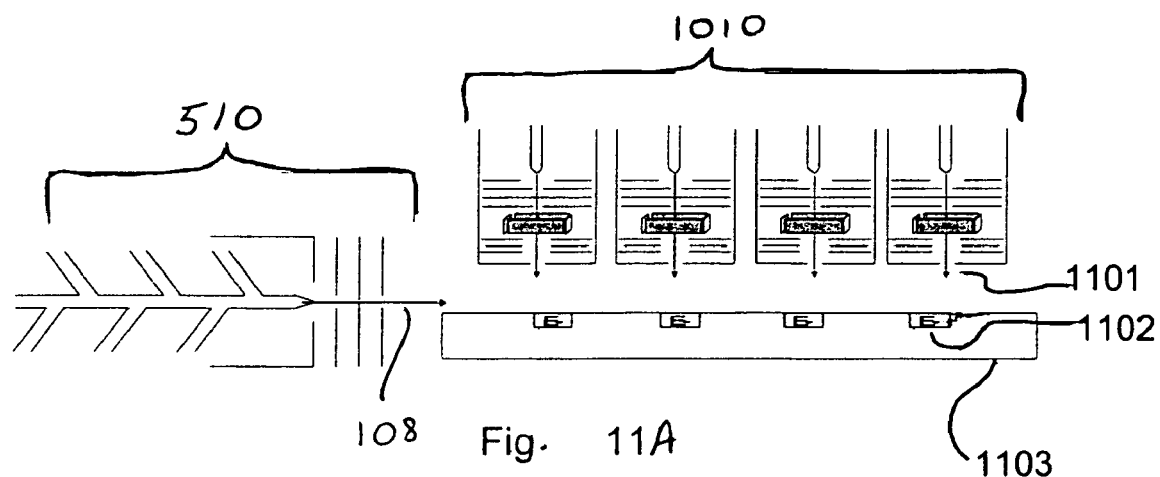
FIGS. 11A-D are schematic diagrams of an embodiment of a multi-array microcolumn electron beam-based nanopatterning process utilizing multi-source injection electrospray equipment with sintering of charged nanoparticles according to another aspect of the present invention.
Figure 11B:
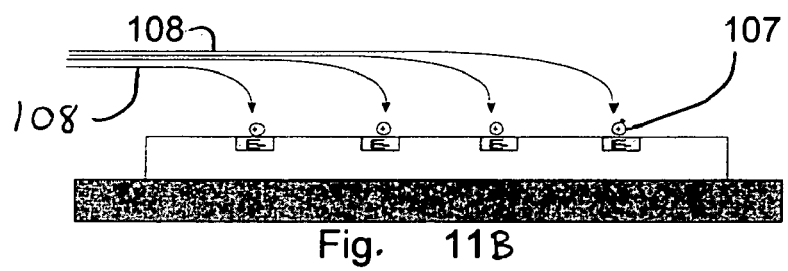
Figure 11C:
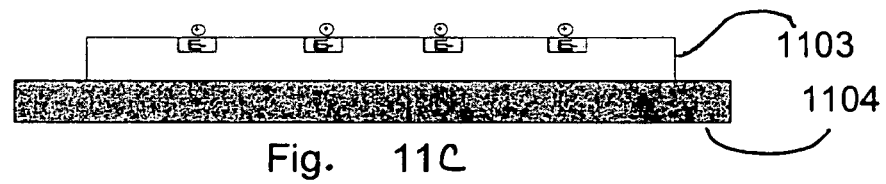
Figure 11D:
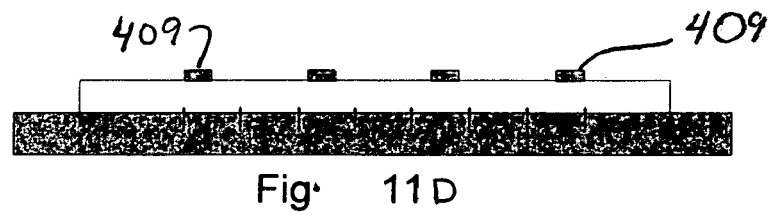

In FIG. 11A, inside a vacuum chamber ranging from $1.0*10^{-4}$ mbarr to more than $1.0*10^{-7}$ mbarr, multi-source electrospray system 510 generates positively or negatively charged liquid nanosize particles 107 in direction 108 of charge pattern 1102. Multi-source inlet electrospray system 510 may spray several materials, depending on the spray needle design. For purity reasons, one or more of the inlet tubes may contain solvent that cleans the path of solution. In FIG. 11B, a plurality of positively charged nanosize particles 107 deposit onto the surface of substrate 1103 and arrange themselves on charge pattern 1102. Because of the multiple inlet electrospray system, several materials, such as insulator, semiconductor, or metal materials, can image pattern 1102 on the same plate without taking substrate 1103 out of the vacuum chamber. In FIG. 11C, global heating source 1104 heats substrate 1103, thereby sintering nanoparticles 107 to form continuous structure 409 (FIG. 11D) that includes nanoparticles 107 without any solvents. Global heating source 1104 may be any suitable device known in the art, such as, for example, a hot plate or a laser.

FIGS. 12A-D are schematic diagrams of an embodiment of a multi-array microcolumn electron beam-based nanopatterning process employing multi-source selection electrospray equipment and sintering of charged nanoparticles according to yet another aspect of the present invention. In FIGS. 12A-D, multi-microcolumn electron beam system 1010 generates array of electron beams 1201 simultaneously incident in parallel on substrate 1203, thereby developing charge pattern 1202. Charge pattern 1202 is thus created in a single step rather than by the scanning of a single beam across entire substrate 1203 multiple times. Array of electron beams 1201 may be used for the fabrication of features having nanoscale dimensions and writes charge pattern 1202 onto substrate 1203. Array of electron beams 1201 may optionally be deflected by electrostatic steering plates. In the embodiment shown in FIG. 12A, the pattern is negatively charged. Substrate 1203 may be formed of any suitable material known in the art, such as, for example, an electret.

Figure 12A:
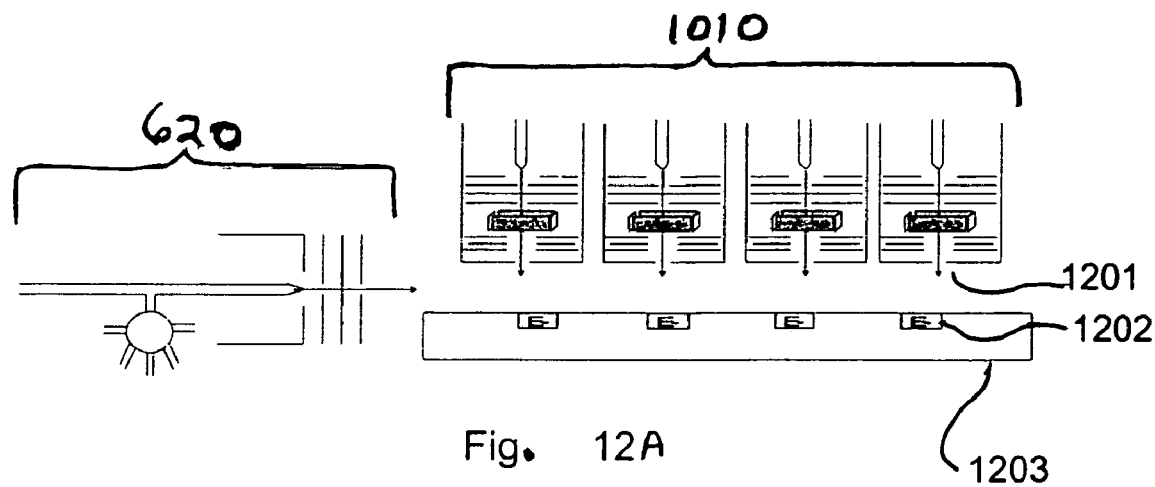
FIGS. 12A-D are schematic diagrams of an embodiment of a multi-array microcolumn electron beam-based nanopatterning process employing multi-source selection electrospray equipment with sintering of charged nanoparticles according to yet another aspect of the present invention.
Figure 12B:
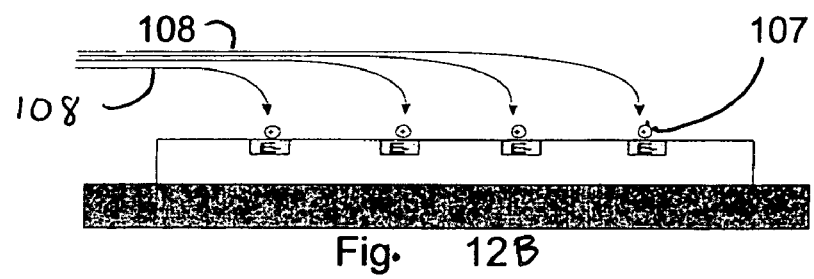
Figure 12C:
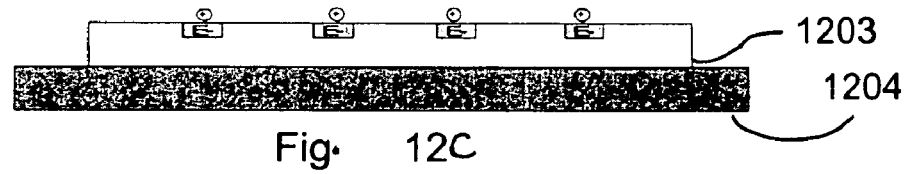
Figure 12D:
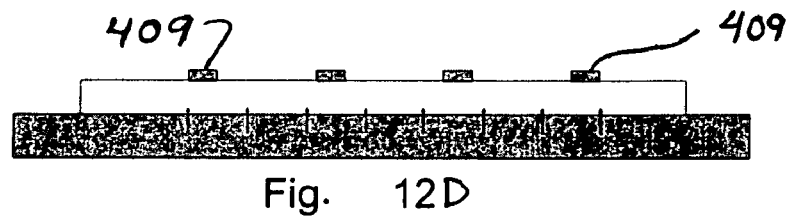

In FIG. 12A, inside a vacuum chamber ranging from $1.0*10^{-4}$ mbarr to more than $1.0*10^{-7}$ mbarr, multi-source selection electrospray system 620 generates positively or negatively charged liquid nanosize particles 107 in direction 108 of charge pattern 1202. Multi-source selection electrospray system 620 may spray several materials, depending on the spray needle design. For purity reasons, one of the inlet tubes may contain solvent that cleans the path of solution. In FIG. 12B, a plurality of positively charged nanosize particles 107 deposit onto the surface of substrate 404 and arrange themselves on charge pattern 1202. Because of the multi-source selection electrospray system, several materials, such as, for example, insulator, semiconductor, or metal materials, can image pattern 1202 on the same plate without taking substrate 1203 out of the vacuum chamber. As seen in FIG. 12C, global heating source 1204 heats substrate 1203, thereby sintering the nanoparticles 107 to form continuous structure 409 (FIG. 12D) that includes nanoparticles 107 without any solvents. Global heating source 1204 may be any suitable device known in the art, such as, for example, a hot plate or a laser.

FIGS. 13A-E are schematic diagrams of an embodiment of an electrospray-based nanopatterning process employing deflectors and sintering of charged nanoparticles, according to one aspect of the present invention. In FIGS. 13A-C, charged nanoscale particles 1302 are dispersed from electrospray equipment with deflectors 1300, 1310, 1320, respectively. A solution of particles and solvent is propelled through the sharp needle by the effect of a voltage differential between the tip of the needle and the plate. The solution can be made of any particle, including, but not limited to, insulating nanoparticles, semiconductor nanoparticles, metal nanoparticles, DNA, proteins, nanotubes, nanowires, and polar or nonpolar solvents. Charged particles 1302 can be precisely deposited to specific area 1301 utilizing the deflectors in electrospray systems 1300, 1310, and 1320. In FIG. 13D, particle 1302 is positively charged. Substrate 1303 may be formed of, for example, an electret. Inside a vacuum chamber ranging from $1.0*10^{-4}$ mbarr to more than $1.0*10^{-7}$ mbarr, global heating source 1304 heats substrate 1303, thereby sintering nanoparticles 1302 to form continuous structure 1305 (FIG. 13E) that includes nanoparticles 1302 without any solvents. Global heating source 1304 may be any suitable device known in the art, such as, for example, a hot plate or a laser.

Figure 14A:
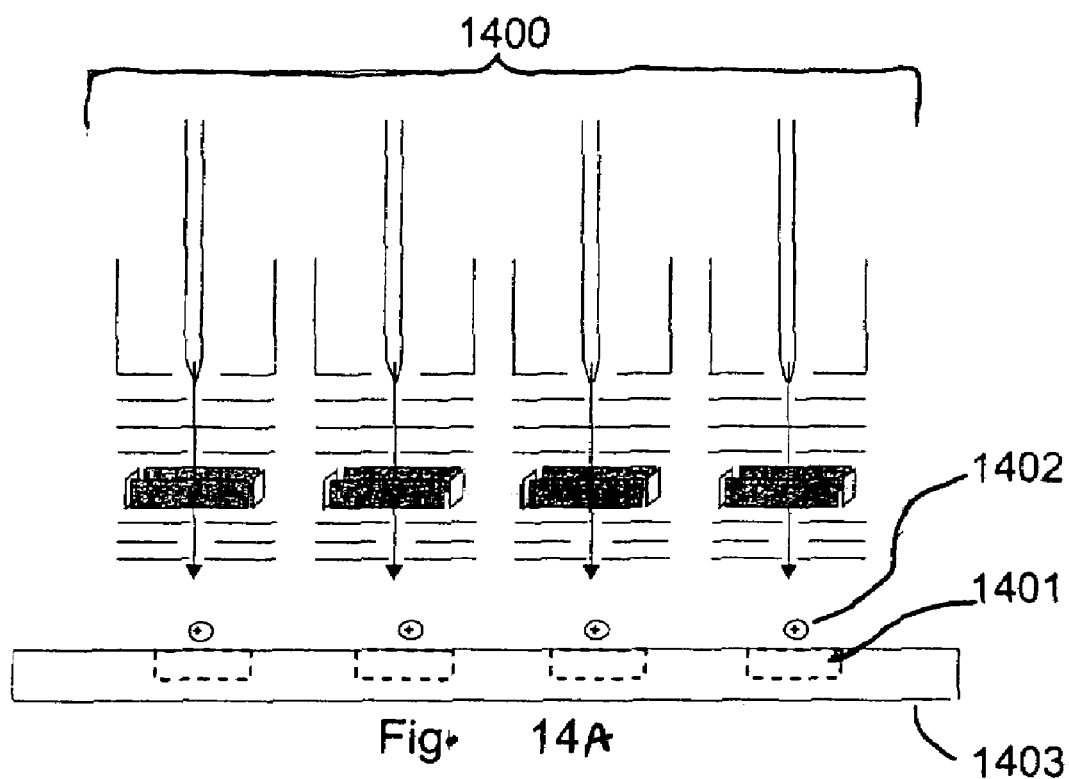
FIGS. 14A-C are schematic diagrams of an embodiment of a multi-array electrospray-based nanopatterning process employing a single source and deflectors with sintering of charged nanoparticles according to one aspect of the present invention.
Figure 14B:
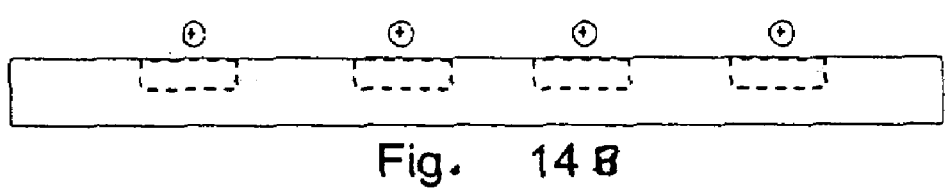
Figure 14C:
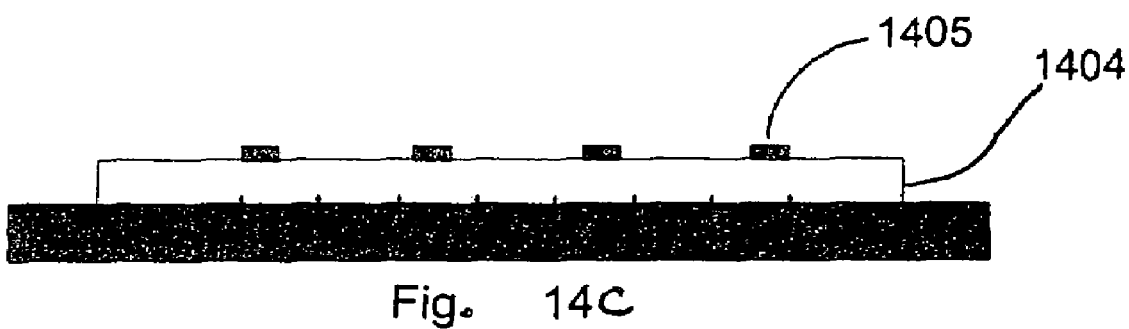

FIGS. 14A-C are schematic diagrams of an embodiment of a multi-array electrospray-based nanopatterning process according to one aspect of the present invention, having a single source and deflectors and sintering of charged nanoparticles. In FIGS. 14A-C, charged nanoscale particles 1402 are dispensed from multi-array electrospray equipment with deflectors 1400. Solution 1402 of particles and solvent is propelled through the sharp needle by the effect of the voltage differential between the tip of the needle and the plate. In some embodiments, solutions can be made of any particle, such as, but not limited to, insulating nanoparticles, semiconductor nanoparticles, metal nanoparticles, DNA, proteins, nanotubes, nanowires, and polar or nonpolar solvents. In this embodiment, charged particle pattern 1402 is created in a single step rather than by the scanning of a single electrospray system with deflector across entire substrate 1403 multiple times.

An array of electrosprays with deflectors 1400 may be used for the fabrication of features having nanoscale dimensions. Charged particles 1402 can be deposited to specific area 1401 using the deflectors in multi-array electrospray system 1400. In the embodiment shown in FIG. 14B, the particle is positively charged. Substrate 1403 may be formed of any suitable material known in the art, such as, for example, an electret. Inside a vacuum chamber ranging from $1.0*10^{-4}$ mbarr to more than $1.0*10^{-7}$ mbarr, global heating source 1404 (FIG. 14C) heats substrate 1403, thereby sintering nanoparticles 1402 to form continuous structure 1405 that includes nanoparticles 1402 without any solvents. Global heating source 1404 may be any suitable device known in the art, such as, for example, a hot plate or a laser.

Figure 15A:
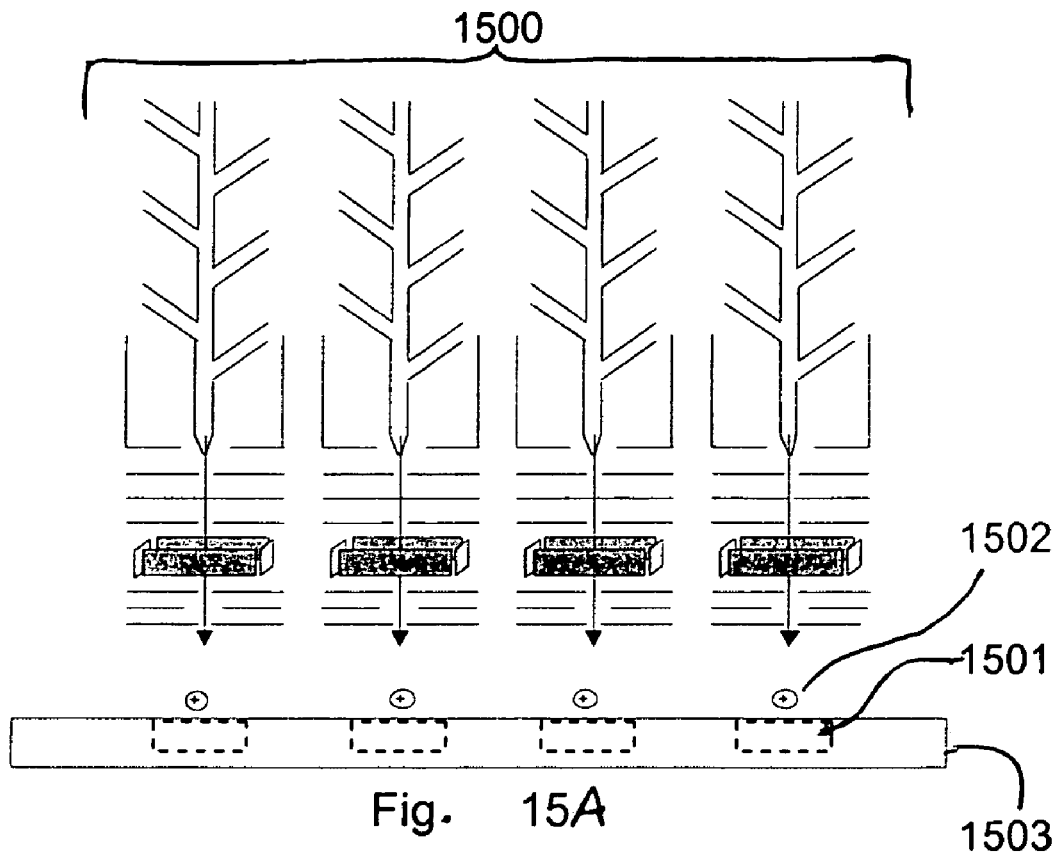
FIGS. 15A-C are schematic diagrams of an embodiment of a multi-array electrospray-based nanopatterning process employing a multi-source injection system with deflectors and sintering of charged nanoparticles according to another aspect of the present invention.
Figure 15B:
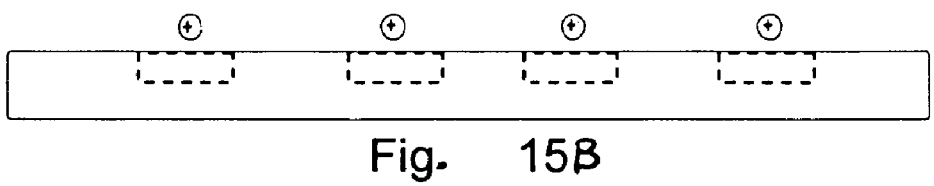
Figure 15C:
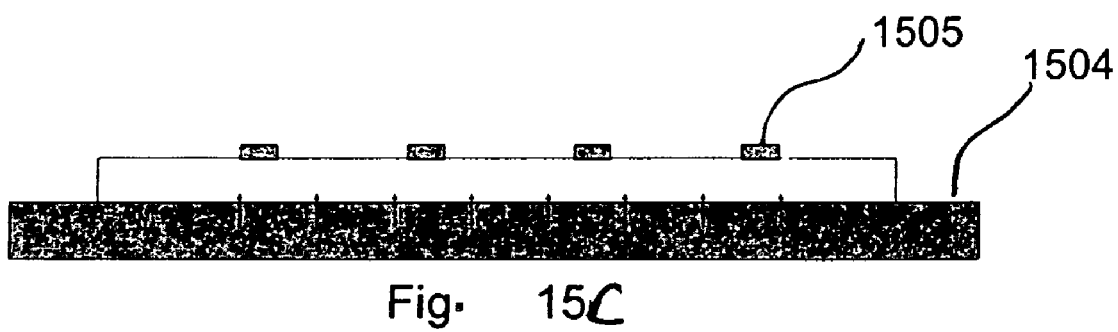

FIGS. 15A-C are schematic diagrams of an embodiment of a multi-array electrospray-based nanopatterning process according to another aspect of the present invention, utilizing a multi-source injection system with deflectors and sintering of charged nanoparticles. In FIGS. 15A-C, charged nanoscale particles 1502 are dispersed from the multi-array and multi-source inlet electrospray equipment with deflectors 1500. Multi-array and multi-source inlet electrospray system 1500 may spray several materials, depending on the spray needle design. Because of the multi source selection system, several materials, such as insulator, semiconductor, or metal materials, can image a pattern on the same plate without taking substrate 1504 out of the vacuum chamber. Solution 1502 of particles and solvent is propelled through the sharp needle by the effect of the voltage differential between the tip of the needle and the plate. The solutions can be made of any particle, such as, but not limited to, insulating nanoparticles, semiconductor nanoparticles, metal nanoparticles, DNA, proteins, nanotubes, nanowires, and polar or nonpolar solvents. In this embodiment, charge particle pattern 1502 may be created in a single step rather than by the scanning of a single electrospray system with deflector across the entire substrate 1503 multiple times.

An array of electrosprays with deflectors 1500 may be used for the fabrication of features having nanoscale dimensions. Charged particles 1502 can be deposited to specific area 1501 using the deflector in multi-array electrospray system 1500. In the embodiment shown in FIG. 15B, the particle is positively charged. Substrate 1503 may be formed of any suitable material known in the art, such as, for example, an electret. Inside a vacuum chamber ranging from $1.0*10^{-4}$ mbarr to more than $1.0*10^{-7}$ mbarr, global heating source 1504 (FIG. 15C) heats substrate 1503, thereby sintering nanoparticles 1502 to form continuous structure 1505 that includes nanoparticles 1502 without any solvents. Global heating source 1504 may be any suitable device known in the art, such as, for example, a hot plate or a laser.

Figure 16A:
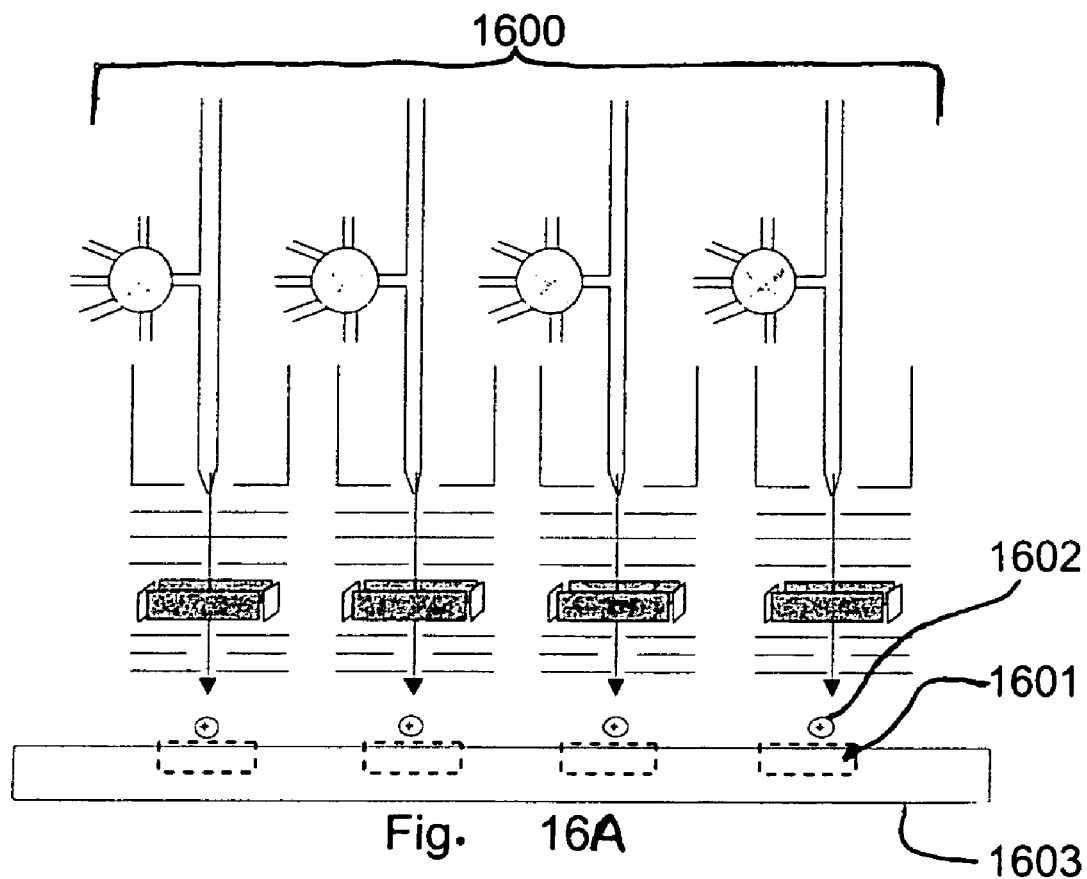
FIGS. 16A-C are schematic diagrams of an embodiment of a multi-array electrospray-based nanopatterning process employing a multi-source selection system with deflectors and sintering of charged nanoparticles according to yet another aspect of the present invention.
Figure 16B:
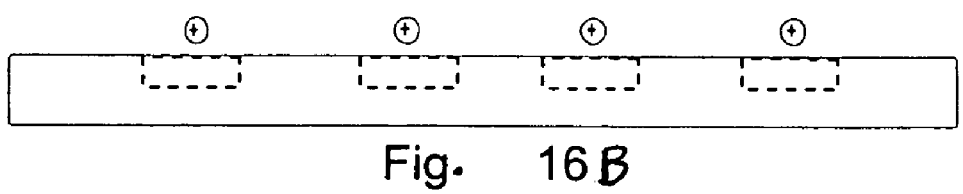
Figure 16C:
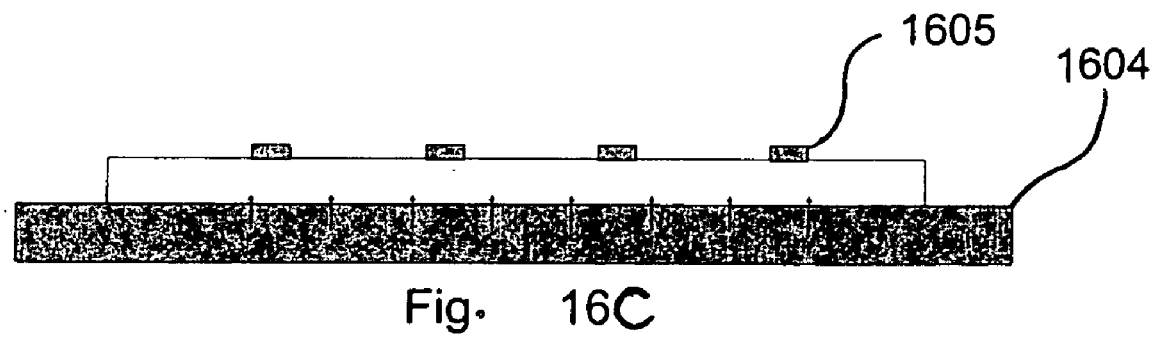

FIGS. 16A-C are schematic diagrams of an embodiment of a multi-array electrospray-based nanopatterning process according to yet another aspect of the present invention, employing a multi-source selection system with deflectors and sintering of charged nanoparticles. In FIGS. 16A-C, charged nanoscale particles 1602 are dispersed from the multi-array and multi-source selection electrospray equipment with deflectors 1600. Multi-array and multi-source inlet electrospray system 1600 may spray several materials, depending on the spray needle design. Because of the multi-source selection system, several materials, such as insulator, semiconductor, or metal materials, can image a pattern on the same plate without taking substrate 1604 out of the vacuum chamber. Solution 1602 of particles and solvent is propelled through the sharp needle by the effect of a voltage differential between the tip of the needle and the plate. Solutions can be made of any particle, such as, but not limited to, insulating nanoparticles, semiconductor nanoparticles, metal nanoparticles, DNA, proteins, nanotubes, nanowires, and polar or nonpolar solvents. In this embodiment, charge particle pattern 1602 may be created in a single step, rather than by the scanning of a single electrospray system with deflector across the entire substrate 1603 multiple times. An array of electrosprays with deflectors 1600 may be used for the fabrication of features having nanoscale dimensions. Charged particles 1602 can be deposited to specific area 1601 using the deflector in multi-array electrospray system 1600. In the embodiment shown in FIG. 16B, the particle is positively charged. Substrate 1603 may be formed of any suitable material known in the art, such as, for example, an electret. Inside a vacuum chamber ranging from $1.0*10^{-4}$ mbarr to more than $1.0*10^{-7}$ mbarr, global heating source 1604 (FIG. 16C) heats substrate 1603, thereby sintering nanoparticles 1602 to form continuous structure 1605 that includes nanoparticles 1602 without any solvents. Global heating source 1604 may be any suitable device known in the art, such as, for example, a hot plate or a laser.

Figure 17:
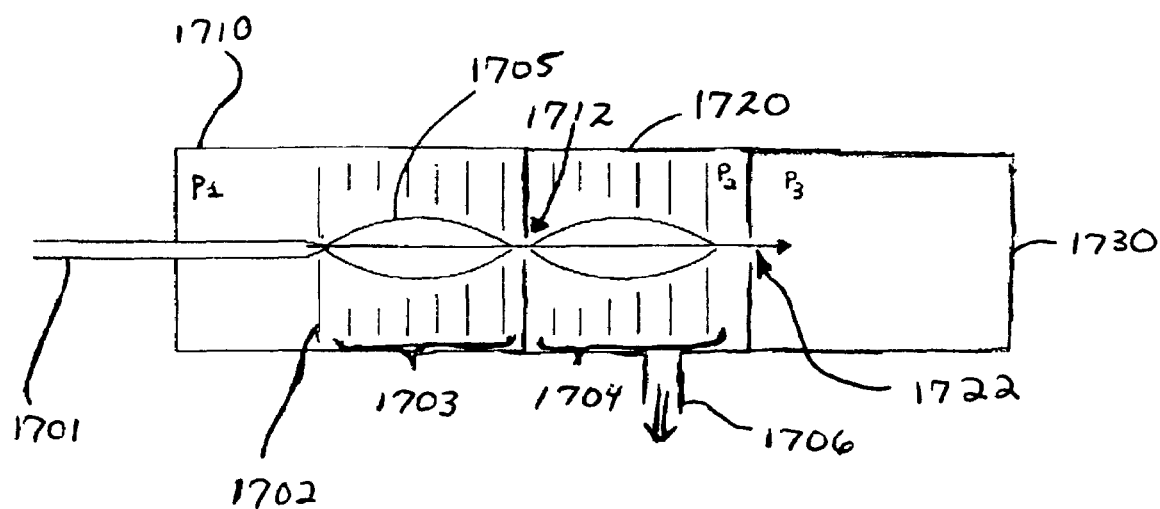
FIG. 17 is a schematic diagram of an embodiment of a differentially vacuum pumped electrospray system with lensing according to one aspect of the present invention.

FIG. 17 is a schematic diagram of an embodiment of a differentially vacuum pumped electrospray system with lensing, according to one aspect of the present invention. In FIG. 17, the mechanism of electrospray allows the spraying of material that is initially in the liquid phase. When spraying such a material into a vacuum, dissolved gas in the liquid or a propensity of the liquid itself to boil may cause large droplets to emerge from the electrospray unit when a spray with nanoscale droplets is desired. In order to fabricate a more general system, it is sometimes useful to initially electrospray into a higher pressure region and then transfer the resultant spray into a lower pressure region. FIG. 17 depicts the schematic of a differential vacuum electrospray assembly. In one embodiment, electrospray needle 1701 and extractor 1702 electrospray into first chamber 1710 having pressure p1, which may be at or close to atmospheric pressure. Chamber 1710 is equipped with multistack electrostatic lens 1703, which can be D.C. only or D.C.+RF and which causes the spray to follow trajectory 1705. Chamber 1710 is separated from second chamber 1720 by aperture 1712, which is held at a pressure p2, which is less than p1 and which may typically be $10^{-3}$ torr. Chamber 1720 may be connected to pump system 1706 for maintaining pressure p2. The purpose of multistack electrostatic lens 1703 is to refocus the electrosprayed beam so that more of the beam will transfer through aperture 1712. Likewise, chamber 1720 is separated from chamber 1730, which is held at pressure p3, which is lower than p2 and may typically be $10^{-6}$ torr, by aperture 1722. Chamber 1720 is equipped with multistack electrostatic lens assembly 1704 for the purpose of refocusing the electrosprayed beam through aperture 1722.

Figure 18:
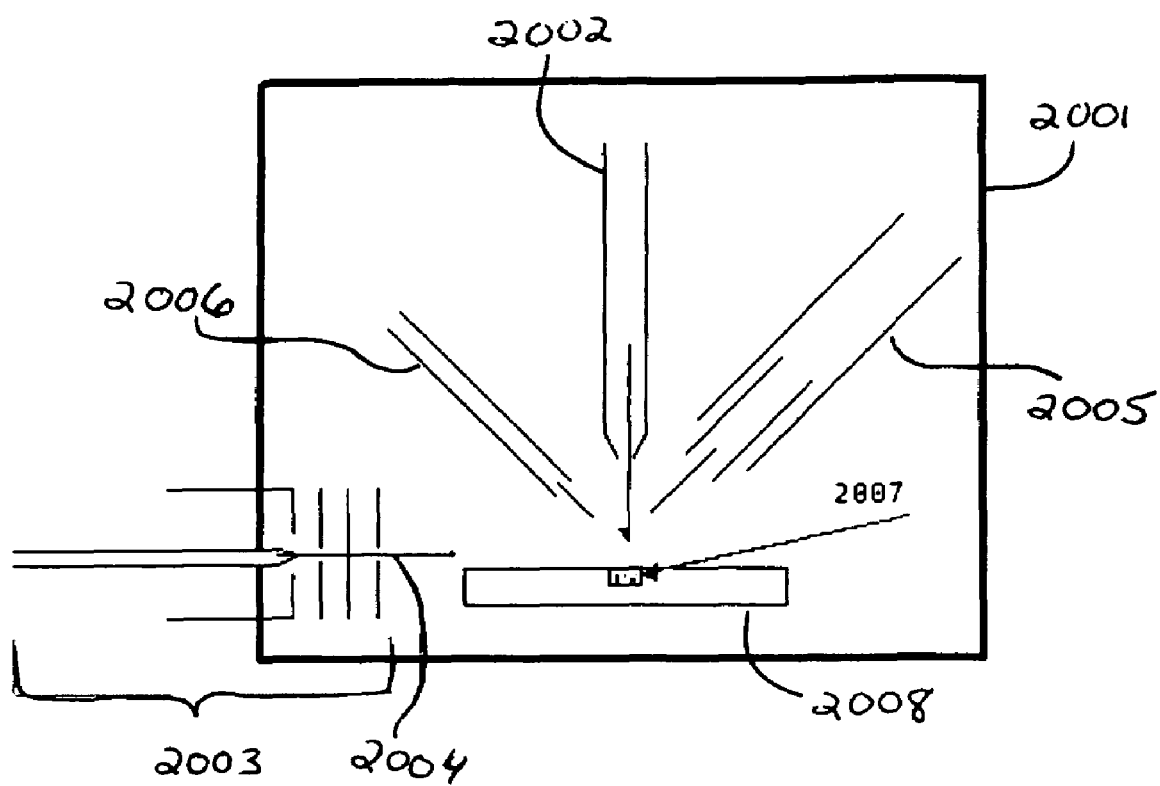
FIG. 18 is a schematic diagram of an embodiment of a system for carrying out electrostatic lithography according to one aspect of the present invention.

FIG. 18 is a schematic diagram of an embodiment of a system for carrying out electrostatic lithography according to one aspect of the present invention, a system for carrying out structure fabrication by means of an electrostatic resist. An electrostatic resist utilizes electrons to store electronic charge in substrates. Each electron stored in the substrate generates an electric field around it. The electric field can polarize and attract a cluster with hundreds of atoms towards the electron storage spot. Thus, each electron has the capability of attracting hundreds of atoms to it. This resist is thus very highly amplified due to electrostatics. The efficiency of the process allows the usage of exposure doses as low as 0.01 μc/cm², which is at least 100 times lower than most commercially available resists. The difference between an electrostatic resist and the electrosprayed functional materials discussed above is that the resist serves as a surface upon which a functional material may be deposited and which may later be lifted off.

FIG. 18 depicts a schematic of a single-pump down system for electrostatic lithography. In FIG. 18, vacuum chamber 2001 encloses electron beam column 2002, electrospray nozzle with electrostatic lens assembly 2003, thin film deposition source 2005, and reactive ion etch column 2006. Electron beam column 2002 generates accelerated electrons, which deposit charge 2007 onto insulating substrate 2008. The electrospray source generates positively charged nanoparticles or nanodroplets 2004, which are then attracted to the oppositely charged substrate. Nanoparticles could be any suitable type of particles known in the art, such as, but not limited to, metals (e.g. Au,Al), insulators (e.g. SiO2) or semiconductors (Si). Nanodroplets may be fluids or gases that adhere to the charged regions and may include conventional resist materials such as, but not limited to, PMMA, which may require further optical or thermal treatment to serve as effective resists, or volatile solvent (e.g. Acetone), which may require that the charged surface be cooled to the freezing point of the solvent. Alternatively, instead of an electrospray source, there may be another charged particle or charged ion source, including ion sources (e.g. Xe) to deposit ions onto the charged surface that has been cooled to the point in which the sticking probability of the ion is high.

After nanoparticles or nanodroplets decorate the electronic charge pattern, and allowing for the fact that in certain cases such nanoparticles or nanodroplets may be further heat, chemically, or optically treated to form a more perfect barrier, a thin film of any material of choice is deposited on the substrate by the thin film deposition source. The thin film deposition source could be any suitable device known in the art, such as, but not limited to, a sputterer, a thermal or electron beam evaporator, or a chemical vapor deposition (CVD) source. The thin film deposition source can be used to deposit metal (e.g Au, Ag, Al, W, Ti, organic conductor), insulator (e.g. SiO2, TiO2, organic insultor), or semiconductor (Si, GaAs, InP, Ge, organic semiconductor such as pentacene) materials, or any suitable material known in the art. Any material of choice can be deposited in thin-film form. Reactive ion etch column 2006 then etches away the nanoparticle or nanodroplet resist film, along with material deposited on them. A patterned thin film of material remains on the substrate.

Figure 19:
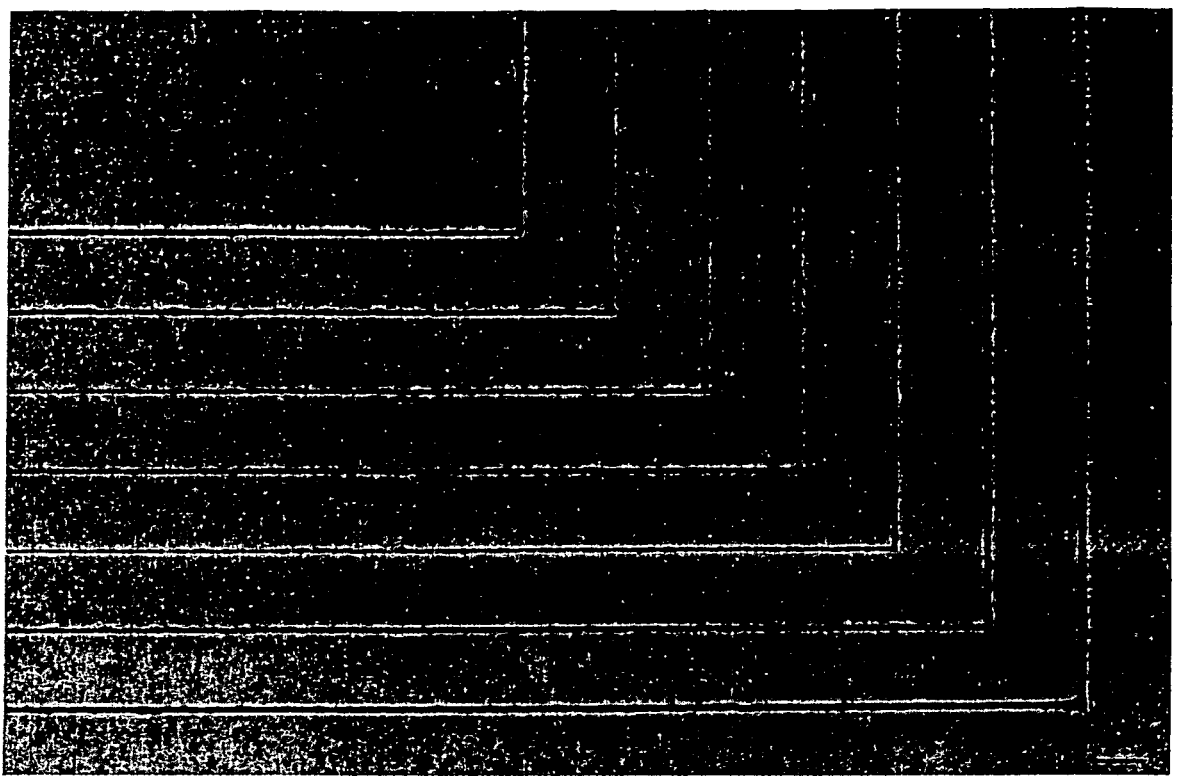
FIG. 19 is an optical micrograph showing an example of patterned gold film fabricated using electrostatic lithography according to one aspect of the present invention.

FIG. 19 is an optical micrograph showing an example of a patterned gold film fabricated using electrostatic lithography according to one aspect of the present invention. In this example, charge from an electron beam was patterned in an L shape onto a polyimide substrate. The substrate was then dusted with particles that were attracted to the charged region and Au was subsequently evaporated onto the entire substrate. Finally the particles were lifted off, leaving the resulting pattern.

Figure 20A:
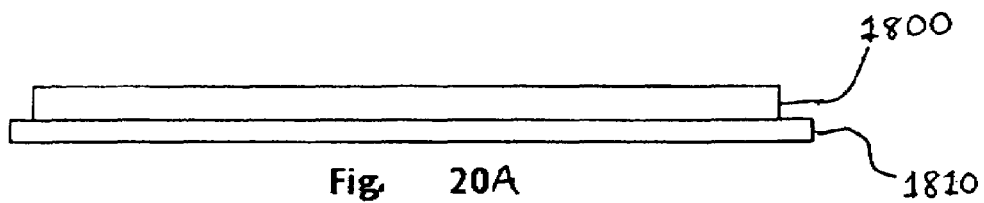
FIGS. 20A-W are a set of sequential schematic diagrams depicting an example step-by-step fabrication of a multi-material multi-layered device according to one aspect of the present invention.

The present system may be used to create a variety of devices and structures, including 1-, 2-, and 3-dimensional nanostructures, micro-electro-mechanical systems, and logic. Some of these structures require the deposition of several materials, and the present invention provides mechanisms for doing so. FIGS. 20A-W depict a process flow for creation of a complimentary metal oxide semiconductor (CMOS), a process that involves the patterned placement of a number of different materials in three dimensions and which could be used to create a large fraction of existing logic devices. The process description of FIGS. 20A-W provides a particular sequence of process steps, but it should be understood that there are a large number of other specific processes which are possible through differently combining the mechanisms for patterning and deposition previously described herein.

Figure 20B:
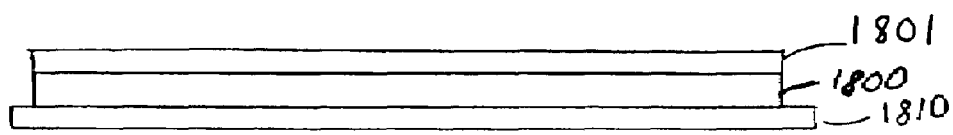
Figure 20C:
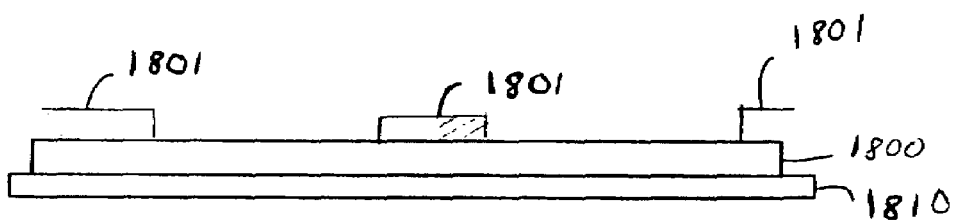
Figure 20D:
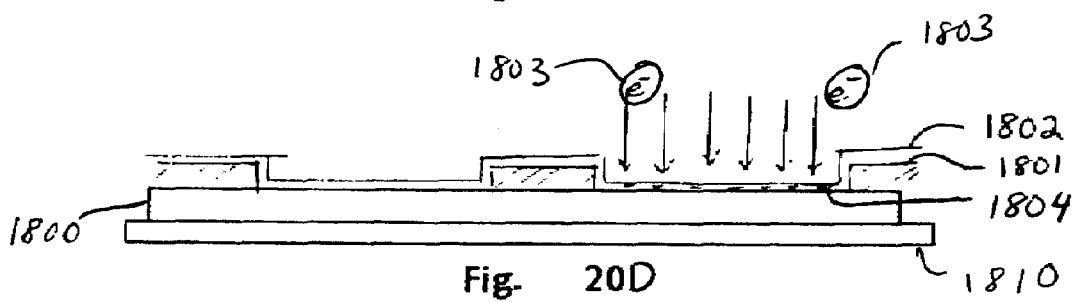

FIGS. 20A-W are a set of sequential schematic diagrams depicting an example step-by-step fabrication of a multi-material multi-layered device according to one aspect of the present invention. As shown in FIG. 20A, step 1 of the process begins with substrate 1800 (e.g. p type Si) and heating and cooling plate 1810. As shown in FIG. 20B, in step 2, oxide (SiO2) 1801 is grown through any suitable method known in the art, such as, for instance, chemical vapor deposition (CVD) onto substrate 1800. As shown in FIG. 20C, in step 3, oxide 1801 is spatially patterned, such as by standard lithographic patterning or by electrostatic patterning. As shown in FIG. 20D, in step 4, the entire surface is covered with volatizable charge retention layer 1802 (VCRL, e.g. Xenon or a high vapor pressure liquid), which may be adhered to the surface from the gas or liquid phase by employing cooling plate 1810 to hold the surface at a temperature such that the sticking potential of the volatizable charge retention layer 1802 freezes (liquid) or has a high striking potential (gas). Charge retention layer 1802 may preferably be a single monolayer. Charge 1803 is then deposited at selected spots 1804 of charge retention layer 1802, such as may be accomplished with an electron beam gun or any other suitable method known in the art.

Figure 20E:
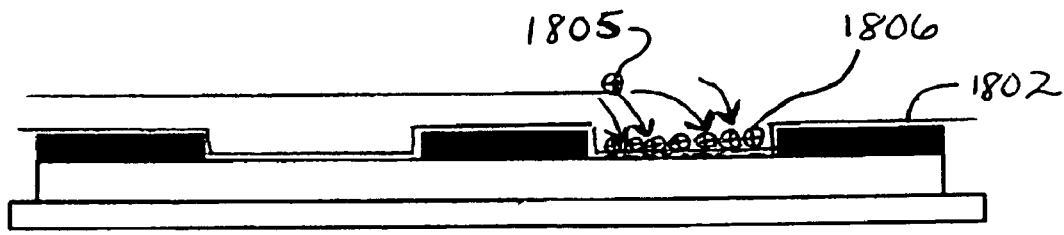
Figure 20F:
Figure 20G:
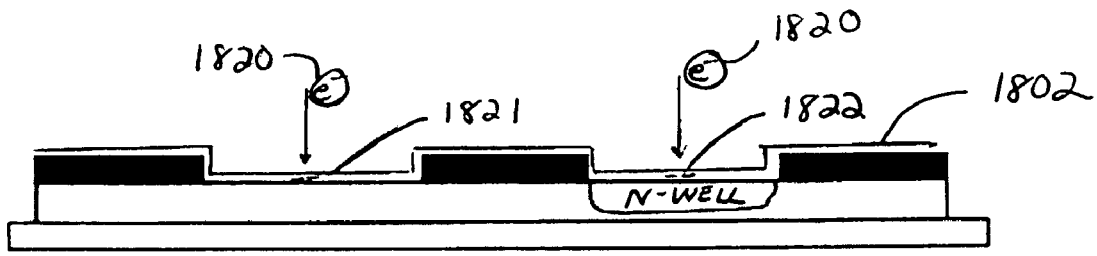
Figure 20H:
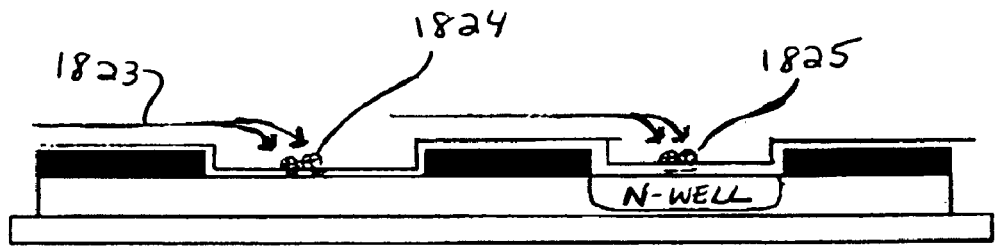

As shown in FIG. 20E, in step 5, positively charged electrospray particles 1805 (e.g. liquid dopant, such as, for example, those manufactured by Honeywell Electronics Materials Corp. or predoped liquid silanes) are made incident to the charged surface such that the positively charged particles are attracted 1806 to the surface in the region where negative charge has been patterned. As shown in FIG. 20F, in step 6, n-doped well 1807 is formed be thermal diffusion of the patterned dopant particles. This step also volatilizes VCRL 1802. As shown in FIG. 20G, in step 7, VCRL 1802 is globally deposited and ebeam 1820 is used to deposit charge patterns 1821 and 1822 for patterning of the gate oxide in the CMOS device. As shown in FIG. 20H, in step 8, electrosprayed oxide 1823 (e.g. nanoparticle silica or spin on glass (SOG)) forms patterns 1824 and 1825.

As shown in FIG. 20I, in step 9, such patterns are then converted to functional gate oxide regions 1826 and 1827, such as may be accomplished by thermally heating the surface by means of heating and cooling plate 1810. As shown in FIG. 20J, in step 10, electron beam 1831 deposits charge patterns 1832 and 1833 to serve as a charge template for the formation of a patterned semiconductor region. As shown in FIG. 20K, in step 11, a semiconductor, which may be, for example, but not limited to, a charged liquid silane or Si nanoparticle emergent from an electrospray unit, is made incident on the charge template regions to form a semiconducting region. Such regions may then be converted, such as by thermal means, to functional patterned semiconductor regions 1834. Such processing may include means to convert inorganic semiconducting materials to nearly single crystalline materials such as laser annealing. Alternatively, some semiconducting materials, such as organic semiconductors, may not require any additional processing to be active. As shown in FIG. 20L, in step 12, VCRL 1802 is globally deposited and ebeam 1841 is used to deposit charge patterns 1842 for n-type source and drain formation.

Figure 20:
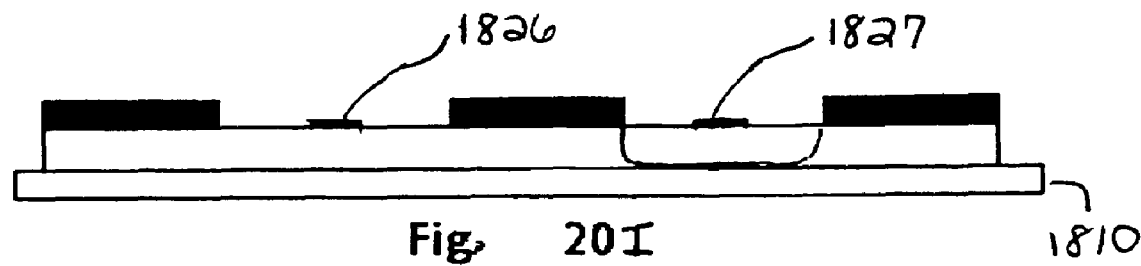
Figure 20:
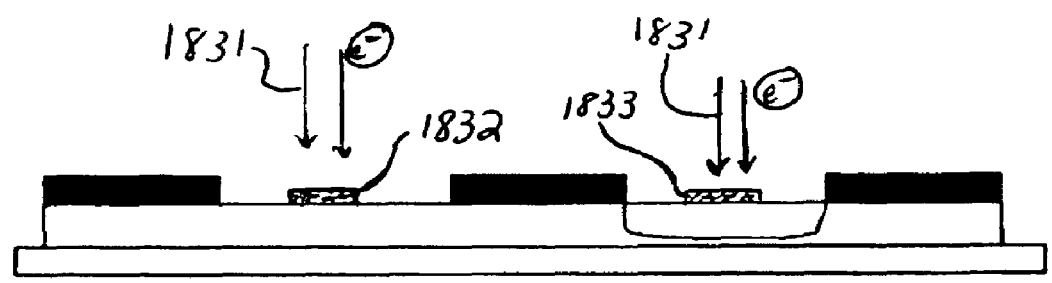
Figure 20:
Figure 20:
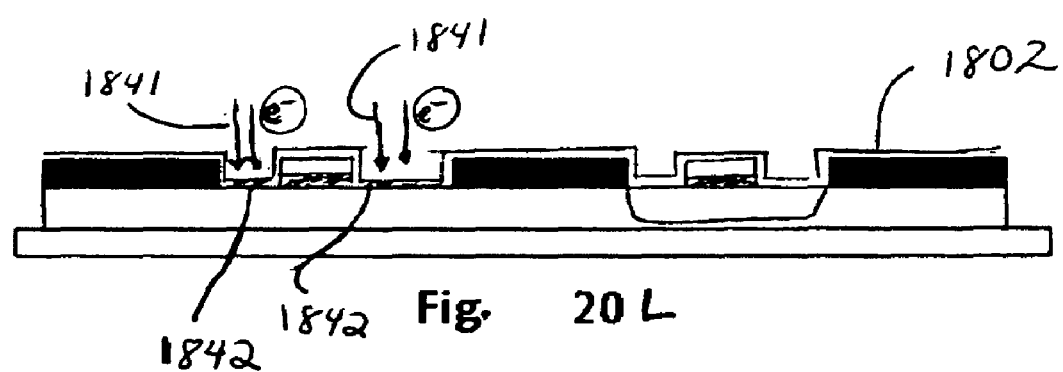
Figure 20M:
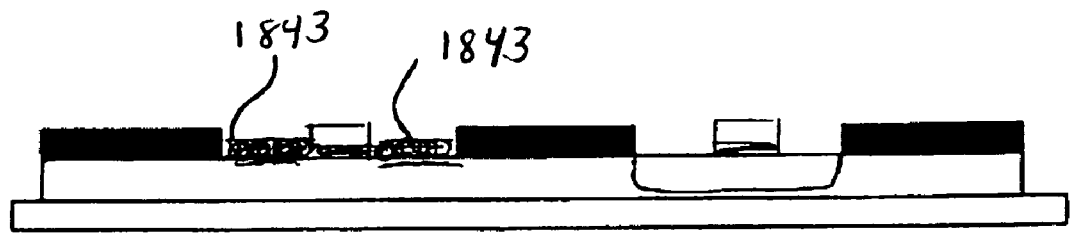
Figure 20N:
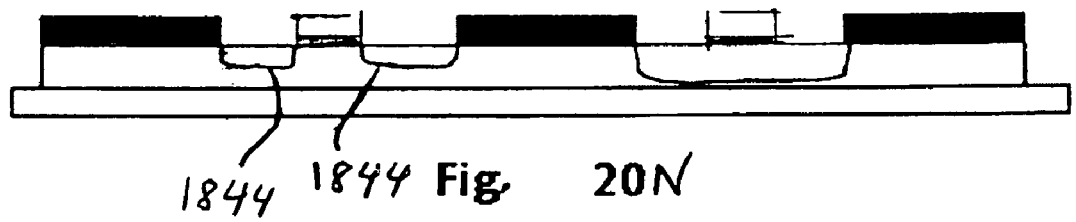
Figure 20:
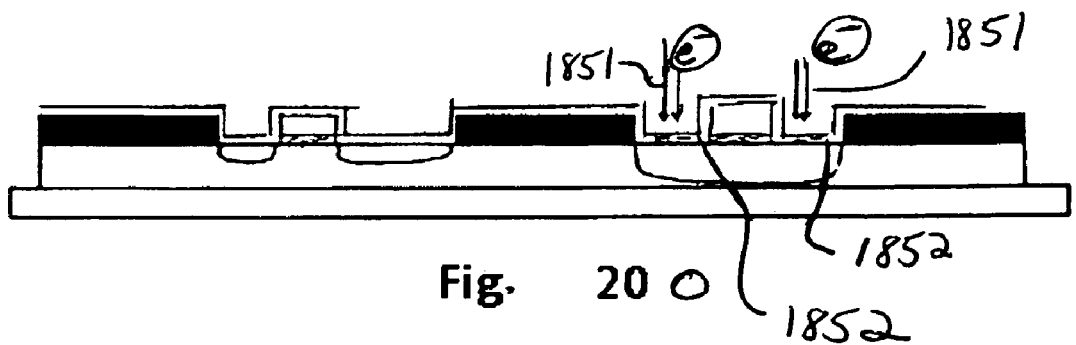
Figure 20P:
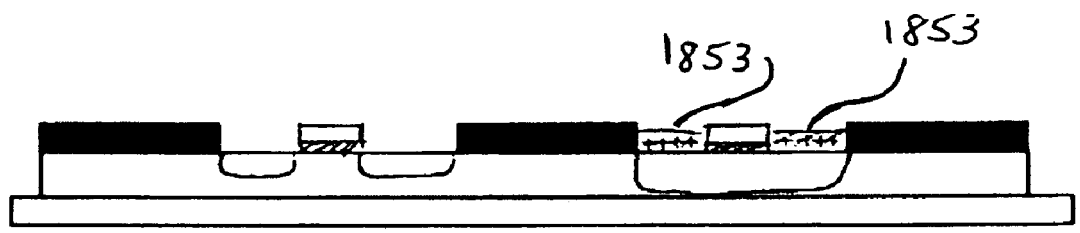
Figure 20:
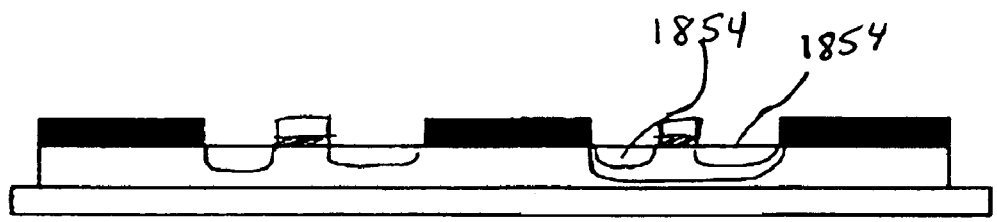
Figure 20:
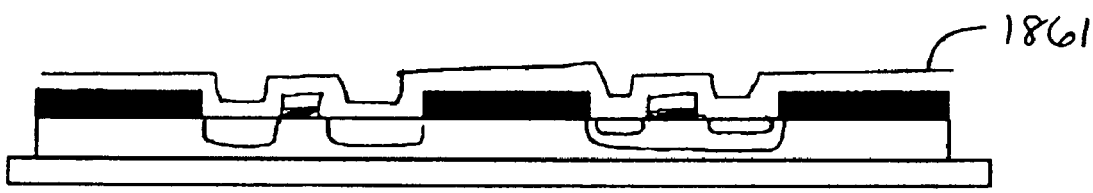
Figure 20:
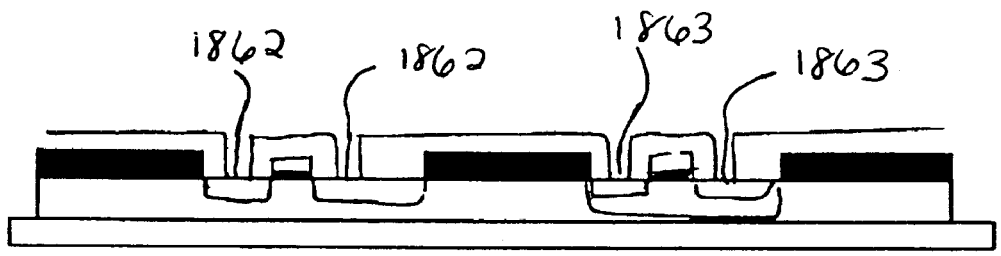
Figure 20:
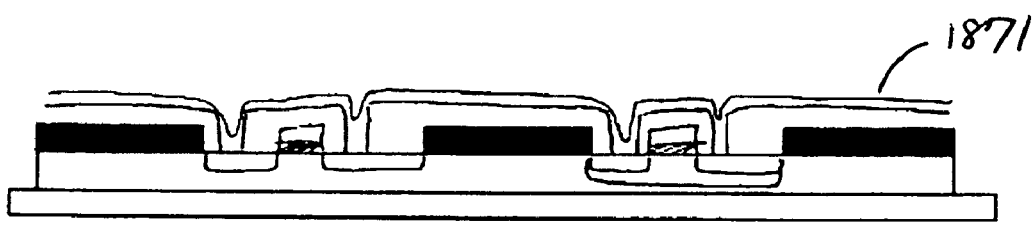
Figure 20:
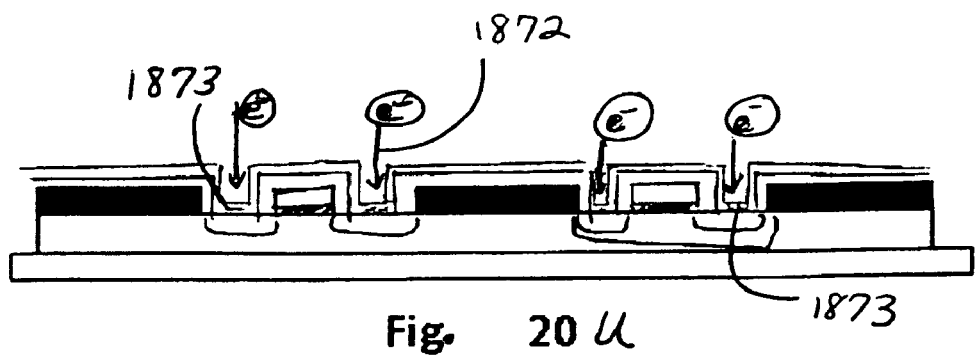
Figure 20:
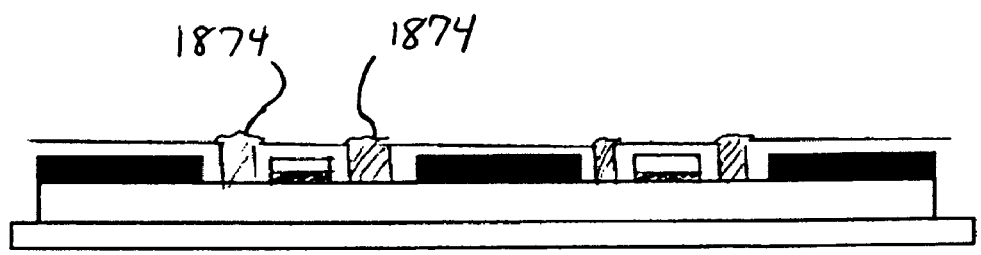
Figure 20:
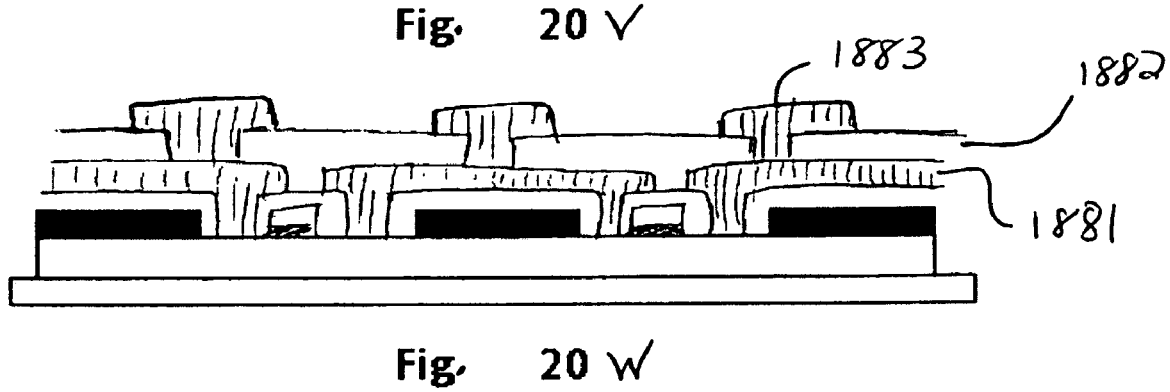

As shown in FIG. 20M, in step 13, electrosprayed n-type semiconductor (e.g. nanoparticle n-doped Si or n-doped silane) or n-type or liquid (e.g. Honeywell Corp.) is deposited onto the charge pattern to form n-type dopant region 1843 which may then be activated to form n-doped source and drain regions 1844 (FIG. 20N—step 14). As shown in FIG. 20-O, in step 15, a VCRL is globally deposited and ebeam 1851 is used to deposit charge patterns 1852 for n-type source and drain formation. As shown in FIG. 20P, in step 16, electrosprayed p-type semiconductor (e.g. nanoparticle p-doped Si or p-doped silane) or p-type or liquid (e.g. Honeywell Corp.) is deposited onto the charge pattern to form p-type dopant region 1853, which may then be activated to form p-doped source and drain regions 1854 (FIG. 20Q—step 17).

As shown in FIG. 20R (Step 18), global oxide (e.g. SiO2) 1861 is deposited and, in FIG. 20S (step 19), patterned to form patterned oxide regions 1862 and 1863. Such patterning may be carried out in situ by the means of an electrostatic resist. Alternatively, steps 18 and 19 may be combined by means of the methods described herein of patterning a charge retention layer, forming a patterned latent charge image, developing that image with a suitable functional material precursor (e.g. spin on glass (SOG), and then converting, such as by thermal means, the oxide precursor to a functional oxide.

As shown in FIG. 20T, in step 20, VCRL 1871 is globally deposited and, in FIG. 20U (step 21), ebeam 1872 is used to deposit charge patterns 1873 for patterning of the metal contact in the CMOS device. As shown in FIG. 20V, in step 22, the charge pattern may be developed with an electrosprayed metal (e.g. nanoparticle metal or liquid metallo-organic precursor) and converted, such as by thermal means, to form functional metal contact regions 1874. Repetition of the oxide and metal deposition steps results in structures such as those shown in FIG. 20W, comprising multiple metal 1881, 1883 and oxide 1882 layers and regions.

It is to be understood that the examples presented are illustrative of a broad range of other examples that may be constructed by combining steps involving the mechanisms of patterning and deposition detailed above. Such a combination of steps may be employed to create a wide variety of patterns of single or multiple materials in three dimensions. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications and substitutions by one of ordinary skill in the art are therefore also considered to be within the scope of the present invention, which is not to be limited except by the claims that follow.

What is claimed is:

1. A method for forming a structure, comprising the steps of:
    forming a charge pattern on a substrate, the charge pattern having a first type of charge; and
    using an electrospray apparatus, introducing a plurality of nanoscale or molecular size scale building blocks to a region proximate the charge pattern, the building blocks having a second type of charge and adhering to the charge pattern to form the structure.

2. The method of claim 1, wherein the building blocks are selected from the group consisting of nanoparticles and organic molecules.

3. The method of claim 1, wherein the charge pattern is formed with an energy beam.

4. The method of claim 3, wherein the energy beam is at least one of an ion beam, an electron beam, or a microcolumn electron beam.

5. The method of claim 1, wherein the charge pattern is formed with a plurality of energy beams.

6. The method of claim 5, wherein the plurality of energy beams is produced by a multi-microcolumn electron beam source.

7. The method of claim 1, further comprising the step of globally sintering the adhered building blocks.

8. The method of claim 1, wherein the electrospray apparatus is a single source electrospray apparatus.

9. The method of claim 1, wherein the electrospray apparatus is a multi-source injection electrospray apparatus.

10. The method of claim 1, wherein the electrospray apparatus is a multi-source selection electrospray apparatus.

11. The method of claim 1, further comprising the step of controlling a velocity of the plurality of building blocks.

12. The method of claim 11, wherein the velocity of at least a portion of the plurality of building blocks is controlled by a voltage differential between the tip of the electrospray apparatus and at least one aperture plate.

13. The method of claim 1, further comprising the step of directing at least one building block to the charge pattern using at least one deflector in the electrospray apparatus.

14. The method of claim 1, wherein the building blocks are created by supplying the electrospray apparatus with at least one material selected from the group consisting of metals, inorganic semiconductors, insulators, DNA, proteins, nanotubes, and nanowires.

* * * * *

UNITED STATES PATENT AND TRADEMARK OFFICE
CERTIFICATE OF CORRECTION

PATENT NO. : 7,651,926 B2  Page 1 of 1
APPLICATION NO. : 11/330865
DATED : January 26, 2010
INVENTOR(S) : Jacobson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 594 days.

Signed and Sealed this

Twenty-third Day of November, 2010

David J. Kappos
*Director of the United States Patent and Trademark Office*